United States Patent
Sakata et al.

(10) Patent No.: US 6,677,633 B2
(45) Date of Patent: Jan. 13, 2004

(54) SEMICONDUCTOR DEVICE

(75) Inventors: Takeshi Sakata, Hino (JP); Satoru Hanzawa, Hachioji (JP); Hideyuki Matsuoka, Nishitokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/408,221

(22) Filed: Apr. 8, 2003

(65) Prior Publication Data

US 2003/0168685 A1 Sep. 11, 2003

Related U.S. Application Data

(63) Continuation of application No. 10/239,417, filed as application No. PCT/JP00/01953 on Mar. 29, 2000, now Pat. No. 6,570,206.

(51) Int. Cl.$^7$ ............................................... H01L 29/78
(52) U.S. Cl. ........................................ 257/296; 257/368
(58) Field of Search ................................ 257/296, 298, 257/316, 368, 369, 300, 329

(56) References Cited

U.S. PATENT DOCUMENTS

| | | |
|---|---|---|
| 5,606,189 A | 2/1997 | Adan |
| 5,675,160 A | 10/1997 | Oikawa |
| 6,570,206 B1 * | 5/2003 | Sakata et al. ............... 257/296 |

FOREIGN PATENT DOCUMENTS

| | | |
|---|---|---|
| DE | 3543937 A1 | 12/1985 |
| EP | 0 224 213 | 11/1986 |
| JP | 03224265 | 1/1990 |
| JP | 04003463 | 4/1990 |
| JP | 04147490 | 10/1990 |
| JP | 08250673 | 3/1995 |
| JP | 2000-113683 | 10/1998 |

OTHER PUBLICATIONS

J. A. Karp, W. M. Regitz, and S. Chou, "Memory I: A 4096–Bit Dynamic MOS RAM," IEEE International Solid–State Circuits Conference, Digest of Technical Papers, 1972, pp. 10–11.

W. Martino and B. F. Croxon, "Memory I: The Inverting Cell Concept for MOS Dynamic RAMS," IEEE International Solid–State Circuits Conference, Digest of Technical Papers, 1972, pp. 12–13, and 208.

K. Nakazato, K. Itoh, H. Mizuta and H. Ahmed, "Silicon Stacked Tunnel Transistor For High–Speed and High–Density Random Access Memory Gain Cells," Electronic Letters, May 13, 1999, vol. 35, No. 10.

Shoji Shukuri, Tokuo Kure, Takashi Kobayashi, Yasushi Gotoh, and Takashi Nishida, "A Semi–Static Complementary Gain Cell Technology For Sub–1 V Supply DRAM's," IEEE Transactions on Electron Devices, Jun. 1994, vol. 41, No. 6, pp. 926–931.

International Search Report in Japanese of Jul. 4, 2000.

* cited by examiner

Primary Examiner—Mark V. Prenty
(74) Attorney, Agent, or Firm—Reed Smith, LLP; Stanley P. Fisher, Esq.; Juan Carlos A. Marquez, Esq.

(57) ABSTRACT

In manufacturing a semiconductor memory by using conventional gain cells, it is difficult to integrate them similarly to 1T1C cells of a DRAM if mask alignment accuracy is considered. In order to achieve integration similarly to that of 1T1C cells by using gain cells, a memory cell block constituted as follows is used. A memory block (MCT) comprises a plurality of memory cells (MC0–MC3). Each memory cell includes a PMOS transistor (M0) for writing and an NMOS transistor (M1) for reading, and information is stored by holding electric charge in a storage node. The write transistors (M0) are arranged in parallel in a plurality of cells, each source-drain path is connected to a data line (DL). The read transistors (M1) are connected in series in a plurality of cells, and are connected to the data line (DL) via a block selection transistor (MB).

8 Claims, 32 Drawing Sheets

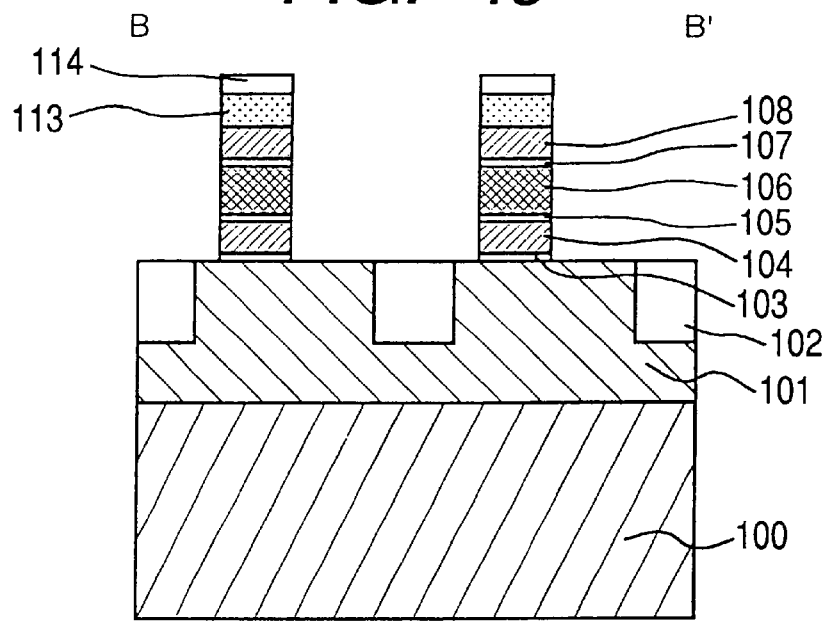
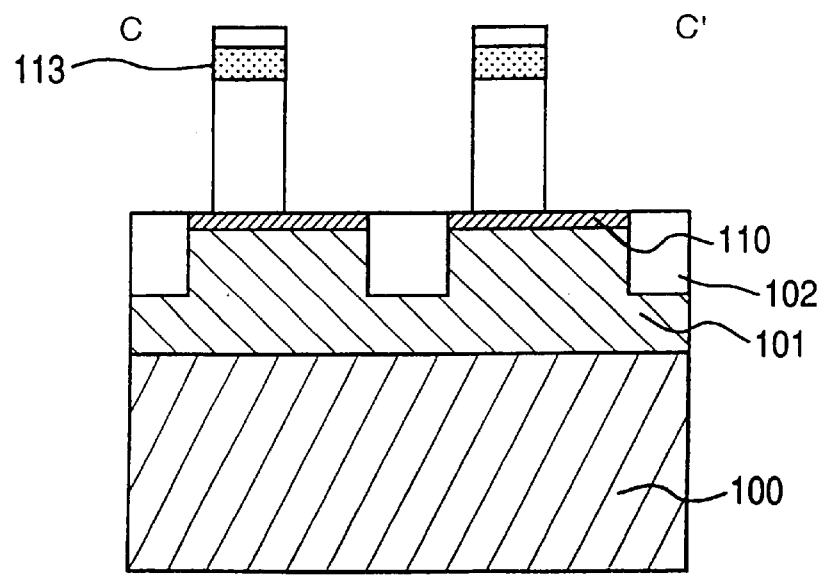

SEMICONDUCTOR DEVICE

This application is a continuation application of U.S. application Ser. No. 10/239,417 filed on Sep. 24, 2002 now U.S. Pat. No. 6,570,206 which is a national stage application of PCT/JP00/01953 filed Mar. 29, 2000.

TECHNICAL FIELD

The present invention relates to a semiconductor device. More specifically, the present invention relates to a semiconductor device including a highly integrated memory using memory cells having an amplification function.

BACKGROUND ART

A dynamic random access memory (DRAM) is widely used as a highly integrated, high-speed memory for a main memory of a personal computer. One-transistor one-capacitor (1T1C) cell having one transistor and one capacitor is used as a memory cell. In recent semiconductor devices, an operating voltage is reduced due to low pressure resistance with finer MOS transistors and low power consumption. Along with it, in a DRAM using one transistor cell, since a memory cell itself has no amplification function, the read signal amount from the memory cell is small and the operation subject to various noises is easily unstable.

As a memory cell which can obtain a large read signal amount by an amplification function, attention is focusing again on the so-called gain cell having an amplification function which has been used before practical utilization of one-transistor cell.

Gain cells are described in IEEE International Solid-State Circuits Conference, DIGEST OF TECHNICAL PAPERS, pp. 10–11, 1972 (hereinafter referred to as reference 1) and IEEE International Solid-State Circuits Conference, DIGEST OF TECHNICAL PAPERS, pp. 12–13, 1972 (hereinafter referred to as reference 2). These are memory cells each having three transistors (hereinafter referred to as a 3-transistor cell) arranged on a silicon surface.

As a gain cell of a new structure, a memory cell having two transistors and one capacitor is proposed in IEE ELECTRONICS LETTERS 13th May 1999 Vol.35 No.10) (hereinafter referred to as reference 3). The memory cell shown in FIG. 4 of the reference 3 may realize very excellent data hold properties by low leak transistors of a vertical type structure. In addition, since the memory cell is of a structure integrating two transistors and one capacitor with each other, it is integrated more highly than the 3-transistor cells of the references 1 and 2.

The memory cell of the reference 3 has a MOS transistor body and four terminals of a wordline, a bitline, a sensing line and a ground voltage. These must be connected to wires, requiring contacts for connection. In consideration of mask alignment accuracy, the cell area may be large. Means for preventing this is not described in the reference 3.

The reason why a DRAM is used widely is that its highly integrated 1T1C cells make the chip area small and its bit unit cost is lower than that of a static random access memory. In order that a memory using the memory cells as shown in the reference 3 may be accepted widely in the market, high integration equal to or more than that of the DRAM is desired.

An object of the present invention is to provide a semiconductor device having a small-area memory which can realize highly integrated memory cells having an amplification function and be operated fast at a low voltage.

DISCLOSURE OF THE INVENTION

Representative inventions disclosed by this application will be described as follows.

To achieve the above object, a semiconductor device according to the present invention has:
  a data line (data line DL in FIG. 1 of the later-described embodiment);
  a first wordline (WL0) crossing the data line;
  a second wordline (WL1) crossing the data line;
  a first memory cell (MC0) provided at the crossing point of the data line and the first wordline; and
  a second memory cell (MC1) provided at the crossing point of the data line and the second wordline,
wherein
the first memory cell has:
  a first transistor (M0) being a signal path at writing;
  a second transistor (M1) being a signal path at reading; and
  a first storage node (N) holding information by storing electric charge,
the second memory cell has:
  a third transistor (M0) being a signal path at writing;
  a fourth transistor (M1) being a signal path at reading; and
  a second storage node (N) holding information by storing electric charge,
  the read signal path from the fourth transistor to the data line includes the second transistor.

In this case, preferably, the gate of the first transistor is connected to the first wordline, and the gate of the third transistor is connected to the second wordline. Further, preferably, one source/drain terminal of the first transistor is connected to the data line and the other is connected to the first storage node, one source/drain terminal of the third transistor is connected to the data line, and the other is connected to the second storage node.

In addition, a semiconductor device according to the present invention has:
  a write data line (data line DLW in FIG. 37 of the later-described embodiment);
  a read data line (DLR);
  a first wordline (WL0) crossing the write data line and the read data line;
  a second wordline (WL1) crossing the write data line and the read data line;
  a first memory cell (MC0) provided at the crossing point of the write data line and the first wordline; and
  a second memory cell (MC1) provided at the crossing point of the write data line and the second wordline,
wherein
the first memory cell has:
  a first transistor (M0) being a signal path at writing;
  a second transistor (M1) being a signal path at reading; and
  a first storage node (N) holding information by storing electric charge,
the second memory cell has:
  a third transistor (M0) being a signal path at writing;
  a fourth-transistor (M1) being a signal path at reading; and
  a second storage node (N) holding information by storing electric charge,
  the read signal path from the fourth transistor to the read data line includes the second transistor.

In this case, preferably, the write data line and the read data line are configured by different wiring layers.

BRIEF DESCRIPTION OF DRAWINGS

FIG. 49 is a B–B' cross-sectional view showing a manufacturing process (4) of the memory cell of Embodiment 5;

FIG. 50 is a C–C' cross-sectional view showing the manufacturing process (4) of the memory cell of Embodiment 5;

BEST MODE FOR CARRYING OUT THE INVENTION

Specific embodiments of a semiconductor device according to the present invention will be described below in detail with reference to the accompanying drawings. In this specification, the term "MOS transistor" is used as an abbreviation representation meaning an insulating gate type field—effect transistor.

Embodiment 1

Figure 1:
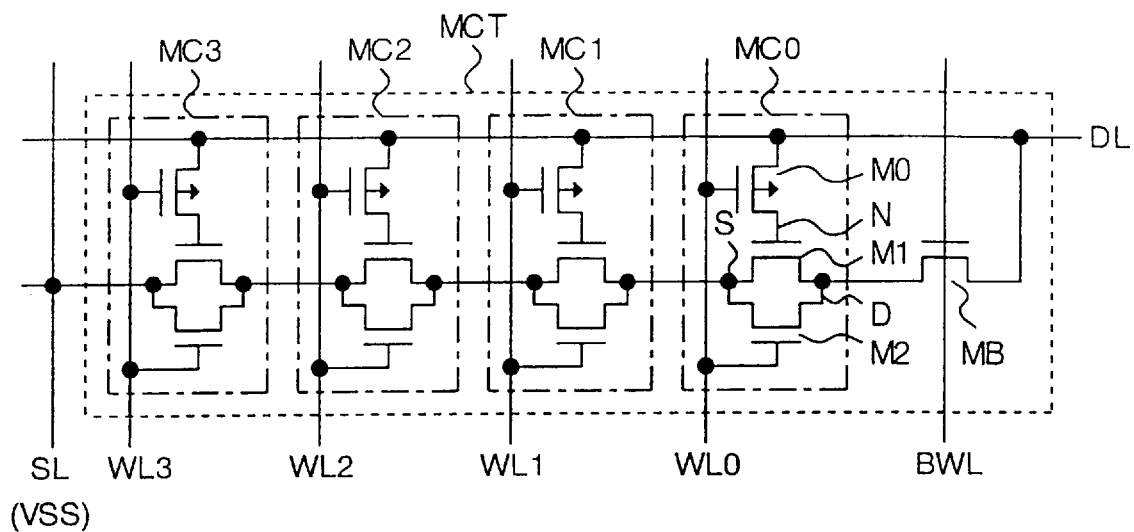
FIG. 1 is a diagram showing a structure example of memory cells of Embodiment 1.

FIG. 1 shows a structure example of a memory cell according to the present invention. Four memory cells MC0–MC3 are one memory cell block MCT. Each of the memory cells has a PMOS transistor M0 for writing, an NMOS transistor M1 for reading, and an NMOS transistor M2 for non-selection provided in parallel with the transistor M1 holding a non-selection state. Electric charge is held in a storage node N to store information. Here, writing and reading mean signal transmission/reception between the memory cell and the data line, which are different from writing and reading operations in the entire memory.

The gates of the write transistors M0 and the non-selection transistors M2 are connected to wordlines WL0–WL3, respectively. The source/drain paths of the write transistors M0 arranged in parallel in the four memory cells are connected to a data line DL. The source/drain paths of the read transistors M1 and the non-selection transistors M2 are connected in series in the four memory cells, and are connected to the data line via a block selection transistor MB controlled by a block selection line BWL.

As explained by showing a specific example later, such memory cell structure can realize a highly integrated memory permitting a stable operation. To simplify the description, the drawing shows the case that the four memory cells configure the memory cell block. The number of the memory cells is not limited to four. Eight and 16 memory cells may configure the memory cell block MCT. When the number of the memory cells is increased, the proportion of the area of the block selection transistor MB per memory cell block MCT is decreased. The total area of a plurality of memory cell blocks realizing a certain memory capacitance is reduced. When the number of the memory cells is increased, the number of the transistors connected in series being a current path at reading is increased so that the read current is small. About 4 to 16 memory cells desirably configure the memory cell block. The same is true in all the following embodiments.

Figure 2:
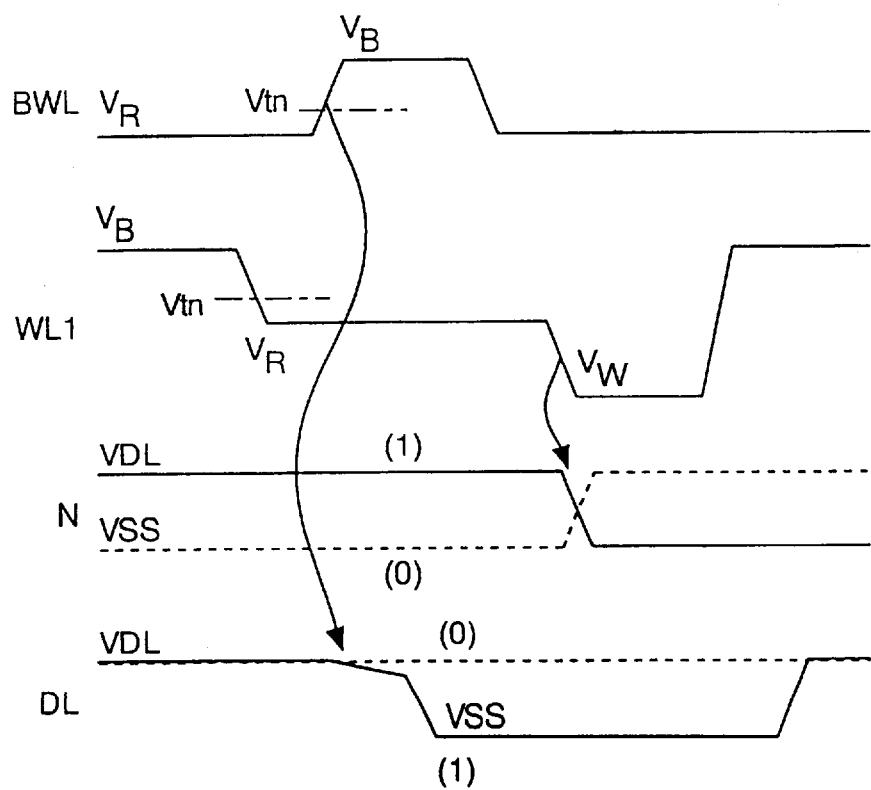
FIG. 2 is a timing chart showing the operation of the memory cell of Embodiment 1.

The operation of the memory cell structure shown in FIG. 1 will be described in accordance with FIG. 2. In the drawing, VB, VR and VW are a standby wordline voltage, a read wordline voltage, and a write wordline voltage, respectively. VDL and VSS are a high (high-level) write voltage and a low (low-level) write voltage, respectively. In the structure shown in FIG. 1, the threshold voltage of the transistors is set so as to realize the following operation. FIG. 2 shows a threshold voltage Vtn of the NMOS transistor.

In a standby state, the block selection line BWL is at the read wordline voltage VR, the block selection transistor MB is in a nonconductive state (off state), and the read transistor M1 and the non-selection transistor M2 of the memory cell MC0 are isolated from the data line DL. The wordlines WL0–WL3 are all at the high-level standby wordline voltage VB. The non-selection transistor M2 is in a conductive state (on state) in each of the memory cells. Inner nodes S, D of the memory cells MC0–MC3 are all at the low level VSS similarly to a source line SL. The read transistor M1 is in the off or on state corresponding to a voltage held in the storage node N.

In operation, any one of the wordlines is at the read wordline voltage VR to select the memory cell. In the following description, the wordline WL1 selects the memory cell MC1.

The non-selection transistor M2 is off in the selected memory cell MC1, and depending on whether the read transistor M1 is in the off or on state, whether the inner nodes S and D are conductive or nonconductive is determined. In the other memory cells MC0, MC2 and MC3, the wordline is held at the standby wordline voltage VB, the non-selection transistor M2 is in the on state, and the inner nodes S and D are conductive. Here, the block selection line BWL is at the standby wordline voltage VB. When the read transistor M1 of the memory cell MC1 is in the on state, an electric current flows from the data line DL via the memory cell block MCT to the source line SL. When the read transistor M1 of the memory cell MC1 is in the off state, no electric current flows from the data line DL to the source line SL. Depending on whether information stored in the storage node N of the memory cell MC1 is '1' or '0' whether an electric current flows or not from the data line DL to the source line SL is determined. In FIG. 2, the information "1" is indicated by (1) and the information "0" is indicated by (0). The same is true in other timing charts. The electric current is detected so that the selected memory cell can discriminate the information stored by the selected memory cell.

In FIG. 2, as the potential of the data line DL is indicated by the solid line, in the floating state of the high level VDL, electrical discharge is performed via the memory cell block MCT, and later, the voltage is amplified by a sensing amplifier.

After completion of the sensing operation, the block selection line BWL is returned to the read wordline voltage VR to shut off the current path. The selection wordline WL1 is at the write wordline voltage VW. The write transistor M0 is on in the memory cell MC1, and then, the voltage of the data line DL is applied to the storage node N to write information into the memory cell MC1. The threshold voltage of the PMOS transistor for writing is set to be in the on state in the write wordline voltage VW and to be in the off state in the read voltage VR and the standby voltage VB.

The block selection transistor MB shuts off the current path from the data line DL via the memory cell block MCT to the source line SL. A stable writing operation can be realized without flowing a through current. In the other memory cells MC0, MC2 and MC3, the wordline is held at the standby wordline voltage VB and the write transistor M0 is in the off state. The voltage of the inner node N is not varied. The selection wordline WL1 is returned to the standby wordline voltage VB. The write transistor M0 is off in the memory cell MC1 to complete the writing operation.

As described above, in the memory cell structure of this embodiment, the non-selection transistor is provided in parallel with the read transistor to reliably form the current path in the unselected memory cell. The write transistor M0 is a PMOS transistor and the non-selection transistor M2 is an NMOS transistor. The complementary structure allows the standby wordline voltage VB to be a sufficiently high voltage so that the write transistor M0 is in the off state having a sufficiently small leak voltage and the non-selection-transistor M2 is in the on state having a sufficiently low channel resistance.

The non-selection transistor of the unselected memory cell is on. As in reading, the source of the read transistor of the selected memory cell is at the low level VSS. Even with coupling from the channel of the read transistor, the voltages of the storage node at writing and reading are almost the same. An effective storage voltage cannot be lowered.

The write transistor M0 is an NMOS transistor. The read transistor M1, the non-selection transistor M2 and the block selection transistor MB are PMOS transistors. They can be operated by reversing the voltage relation for control. In some cases, it can simplify the manufacturing process. In the feature aspect, the PMOS transistor typically has a conductance smaller than that of the NMOS transistor. The structure of FIG. 1 is preferable so that the write transistor M0 to reduce a leak current is a PMOS transistor, and the read transistor M1, the non-selection transistor M2 and the block selection transistor MB to lower the on-resistance are NMOS transistors.

Japanese Published Unexamined Patent Application No. Hei 4-3463 or Hei 4-147490 discloses a memory cell structure having a memory cell block by cascade connecting 1T1C DRAM cells. The memory cell structure disclosed in these publications performs a serial operation for reading in the order in which memory cells are written in a block unit. On the contrary, the memory cell structure of the present invention can access an arbitrary memory cell without damaging information of the unselected memory cell in the memory cell block. The memory cell structure of the present invention can perform the same control as that of a typical DRAM and can realize equivalent access time.

The reading operation from the memory cell and the writing operation into the memory cell are described above. The reading or writing operation as a memory is performed by signal transmission/reception to/from outside after completion of the sensing operation. Information read from the memory cell is re-written to perform a refresh operation.

After the reading and re-writing operation, the state of the storage node of the selected memory cell is inverted. In such a case, as described in the reference 2, a flag indicating that information is a positive logic or a negative logic is stored, and after being ORed with the flag, signal transmission/reception to/from outside is performed to conduct the reading or writing operation properly. Otherwise, an operation is performed in two cycles so that the storage node in the memory cell is inverted twice to return it to the original state. In this case, the memory cycle time is increased, but the influence to access time is small and thee area penalty is low.

Figure 3:
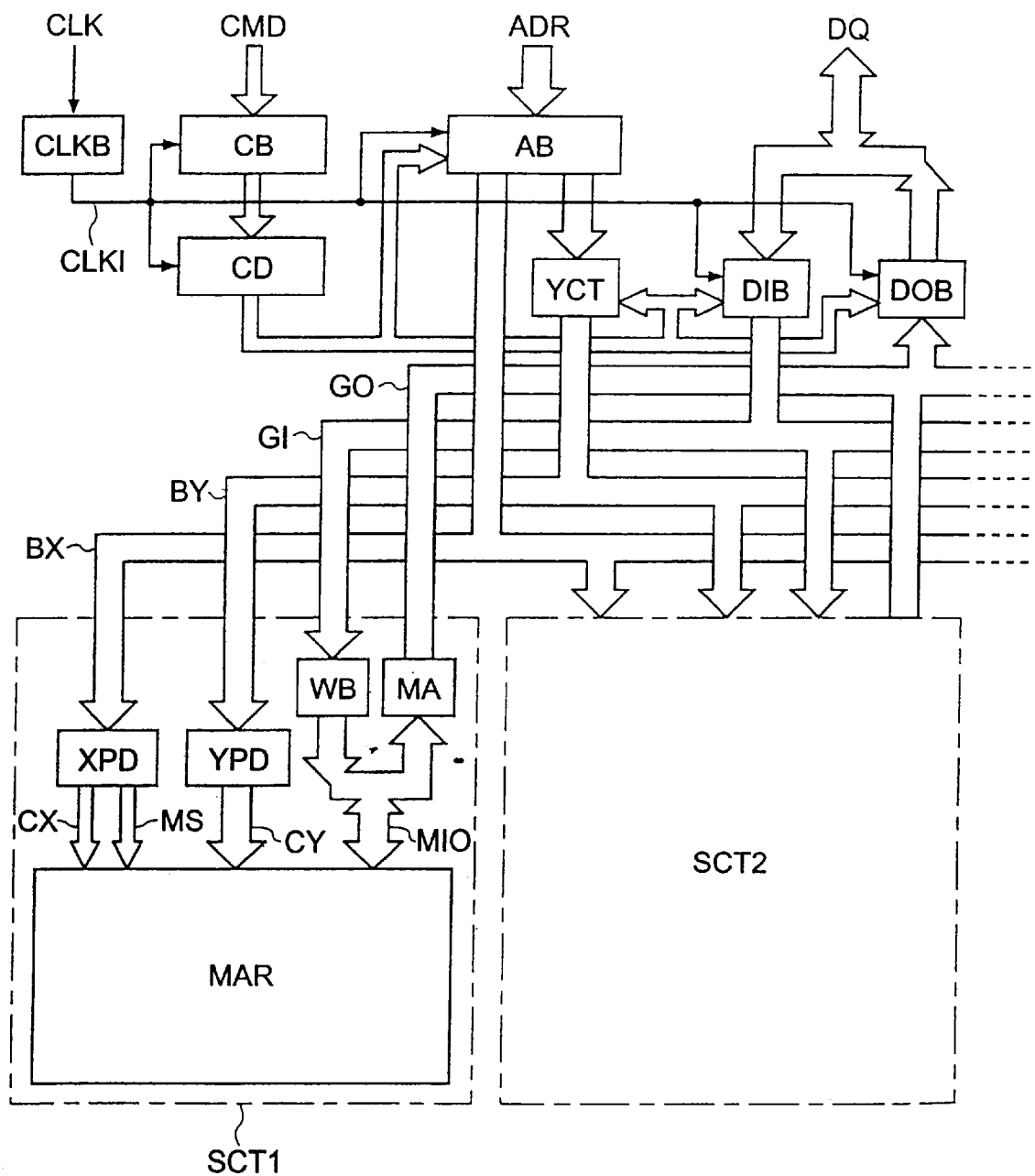
FIG. 3 is a block diagram showing a structure example of a synchronous type memory.

The overall structure of the memory using the memory cell structure will be described. FIG. 3 is a block diagram of an essential part of a structure example of a synchronous type memory. There are provided a clock buffer CLKB, a command buffer CB, a command decoder CD, an address buffer AB, a column address counter YCT, an input buffer DIB, and an output buffer DOB. Sectors SCT0, SCT1, . . . including a memory array MAR are provided. The sector corresponds to a bank. A plurality of sectors per bank may be accepted. The sector has a row pre-decoder XPD, a column pre-decoder YPD, a write buffer WB and a main amplifier MA.

The circuit blocks play the following role. The clock buffer CLKB distributes an external clock CLK as an internal clock CLKI to the command decoder CD. The command decoder CD generates a control signal controlling the address buffer AB, the column address counter YCT, the input buffer DIB and the output buffer DOB corresponding to a control signal CMD from outside. The address buffer AB fetches an address ADR from outside with the desired timing corresponding to the external clock CLK to send a row address BX to the row address pre-decoder XPD. The row address pre-decoder XPD pre-decodes the row address BX to output a row pre-decode address CX and a mat selection signal MS to the memory array MAR.

The address buffer AB sends a column address to the column address counter YCT. The column address counter YCT, with the address as an initial value, generates a column address BY performing a burst operation. The column address pre-decoder YPD pre-decodes it to output a column pre-decode address CY to the memory array MAR. The input buffer DIB fetches input/output data DQ to/from outside with the desired timing to output write data GI to the write buffer WB.

The write buffer WB outputs the write data GI to a main input/output line MIO. The main amplifier MA amplifies the signal of the main input/output line MIO to output read data GO to the output buffer DOB. The output buffer DOB outputs the read data GO to the input/output data DQ with the desired timing.

The memory cell structure according to the present invention is used to realize a synchronous type memory of the same block structure as that of the synchronous DRAM (SDRAM). The synchronous type memory which is synchronized with the external clock CLK to fetch a command and an address and input and output data, can be operated at high frequencies and a high data rate can be realized. The memory cell structure according to the present invention is not limited to the SDRAM and can be applied to various high-speed memory systems developed for a DRAM using 1T1C memory cells.

Figure 4:
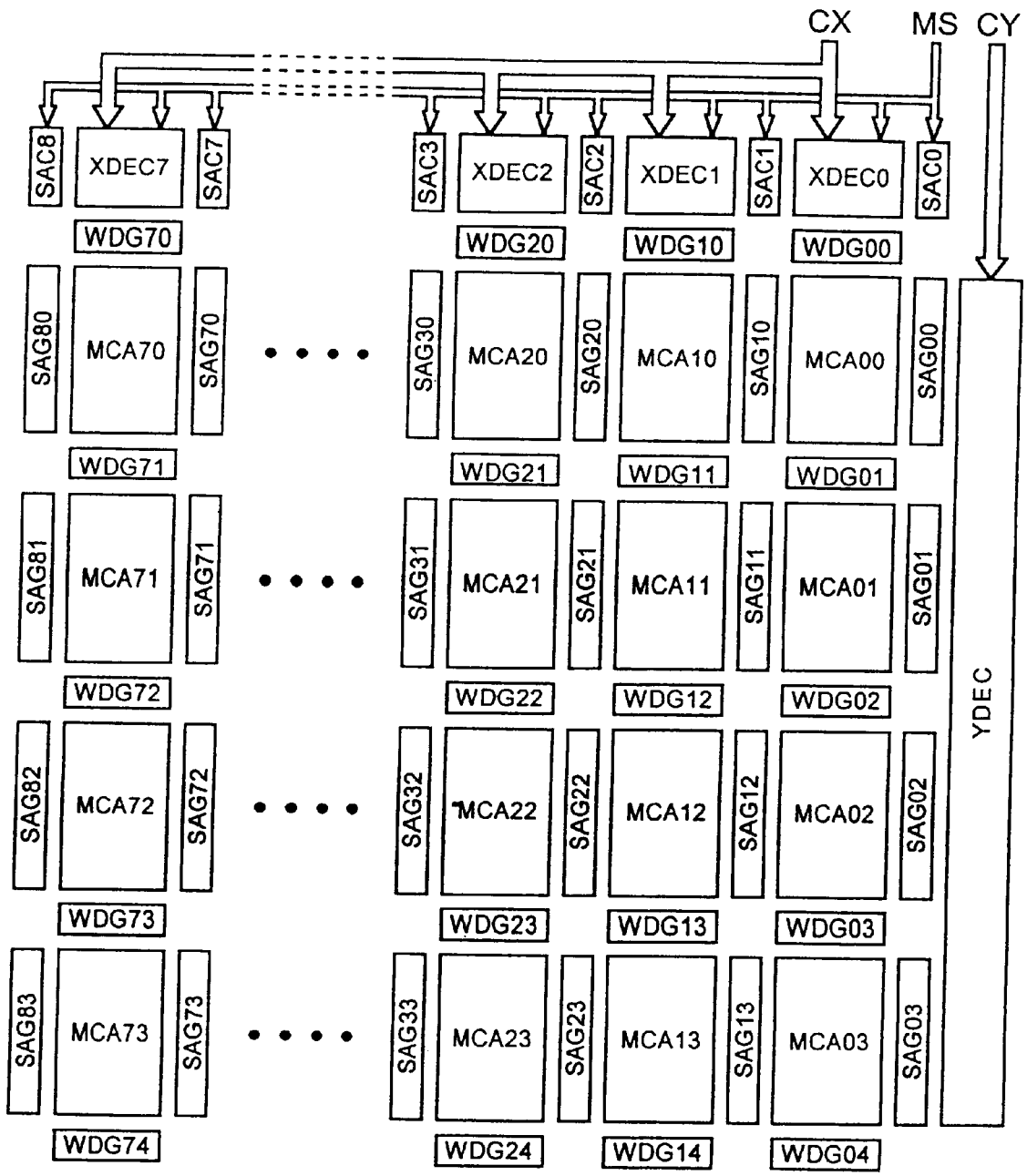
FIG. 4 is a block diagram showing a structure example of a memory array part shown in FIG. 3.

FIG. 4 shows a structure example of the memory array MAR in FIG. 3. Based on sub-word driver parts WDG00–WDG74 and sensing amplifier parts SAG00–AG83, it is divided into a plurality of (8×4=32 in the drawing) sub-arrays MCA00–MCA73. The sub-word driver parts WDG00–WDG74 are operated by being selected by row decoders XDEC1–XDEC7. The sensing amplifier parts SAG00–SAG83 are controlled by sensing amplifier control circuits SAC1–SAC8 and are selected by a column decoder YDEC.

Figure 5:
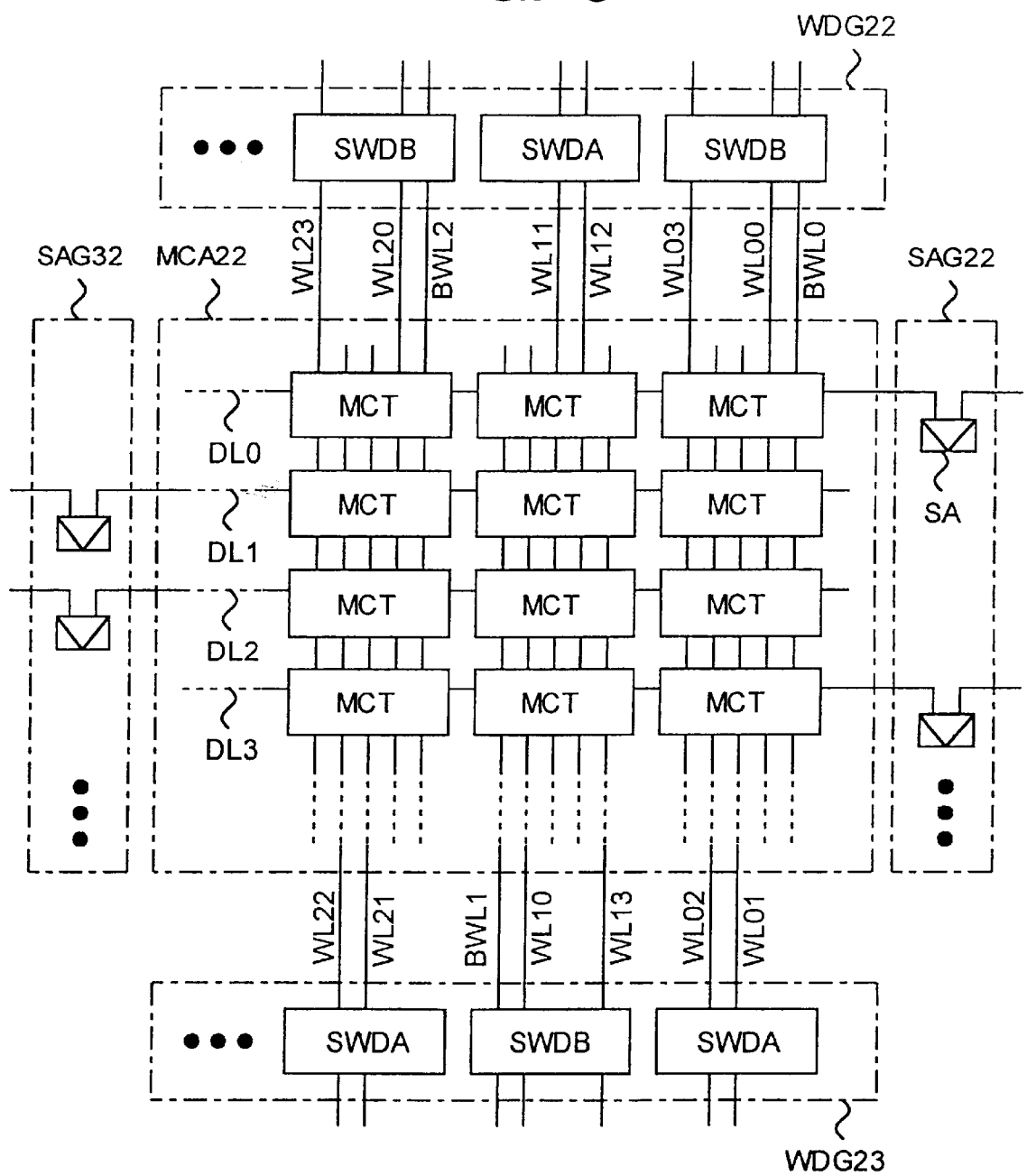
FIG. 5 is a diagram showing a structure example of a sub-array shown in FIG. 4.

FIG. 5 shows an inner structure by taking out the sub-array MCA22, the sub-word driver parts WDG22, WDG23 and the sensing amplifier parts SAG22, SAG 32 adjacent thereto in FIG. 4. The sub-array MCA 22 is configured by arranging the memory cell blocks MCT of the structure as shown in FIG. 1 in a matrix form. As in FIG. 1, each of the memory cell blocks is controlled by four wordlines (i.e., WL00 to WL03) and the block selection line (i.e., BWL0) and transmits/receives a signal to/from the data line (i.e., DL0). The wordlines WL00–WL03, WL10–WL13, WL20–WL23, . . . and the block selection lines BWL0, BWL1, BWL2, . . . are driven by any one of sub-word driver blocks SWDB, SWDA in the sub-word driver parts WDG22, WDG23. The sub-word driver block SWDA is a circuit driving two wordlines. The sub-word driver block SWDB is a circuit driving the block selection line in addition to two wordlines. The data lines DL0, DL1, DL2, DL3, are connected to any one of the sensing amplifiers SA in the sensing amplifier parts SAG22, SAG3.

The structure used here is called a hierarchical wordline structure for a row system and is called a multi-division data line structure for a column system. Both apply the structure typically used in a DRAM. The memory cell array is divided into a plurality of sub-arrays. The wordline and the data line are shortened to perform a high-speed operation. The sub-word driver parts WDG00–WDG74 and the sensing amplifier parts SAG00–SAG83 are all shared by two sub-arrays except for ones arranged at the edge so that the area can be prevented from being increased.

Figure 6:
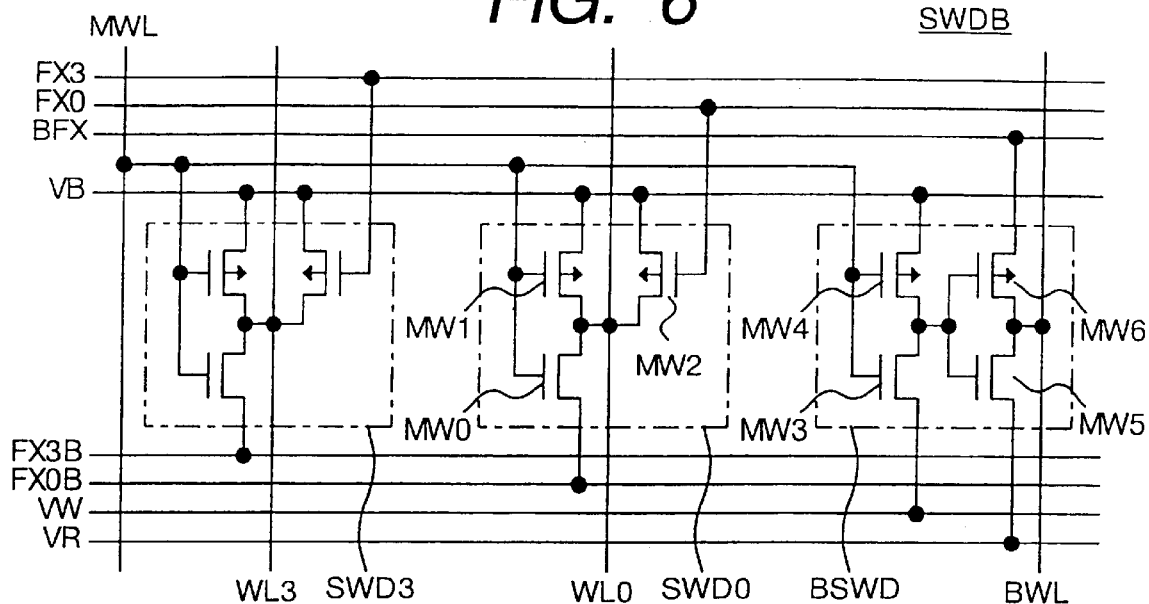
FIG. 6 is circuit diagram showing a structure example of a sub-word driver shown in FIG. 5.

FIG. 6 shows a structure example of the sub-word driver block SWDB. In the drawing, SWD0 and SWD3 are sub-word drivers driving the wordlines WL0, WL3 and have NMOS transistor MW0 and PMOS transistors MW1, MW2, respectively. BSWD is a driver of the block selection line BWL and has NMOS transistors MW3, MW5 and PMOS transistors MW4, MW6. The sub-word driver block SWDB is selected by a main wordline MWL selectively driven by decoding the row address by the row decoder. The main wordline MWL is wired, on the sub-array, by a metal layer as an upper layer not used in the memory cell. Selection signal lines FX0, FX3, FX0B and FX3B of the sub-word drivers SWD0, SWD3 and a control signal line BFX and the power source wires VB, VW and VR of the block selection signal driver BSWD are provided on the sub-word driver part.

The sub-word driver block SWDA in FIG. 5 may be configured by only two sub-word drivers by removing the block selection line driver BSWD from the structure of the sub-word driver block SWDB.

Figure 7:
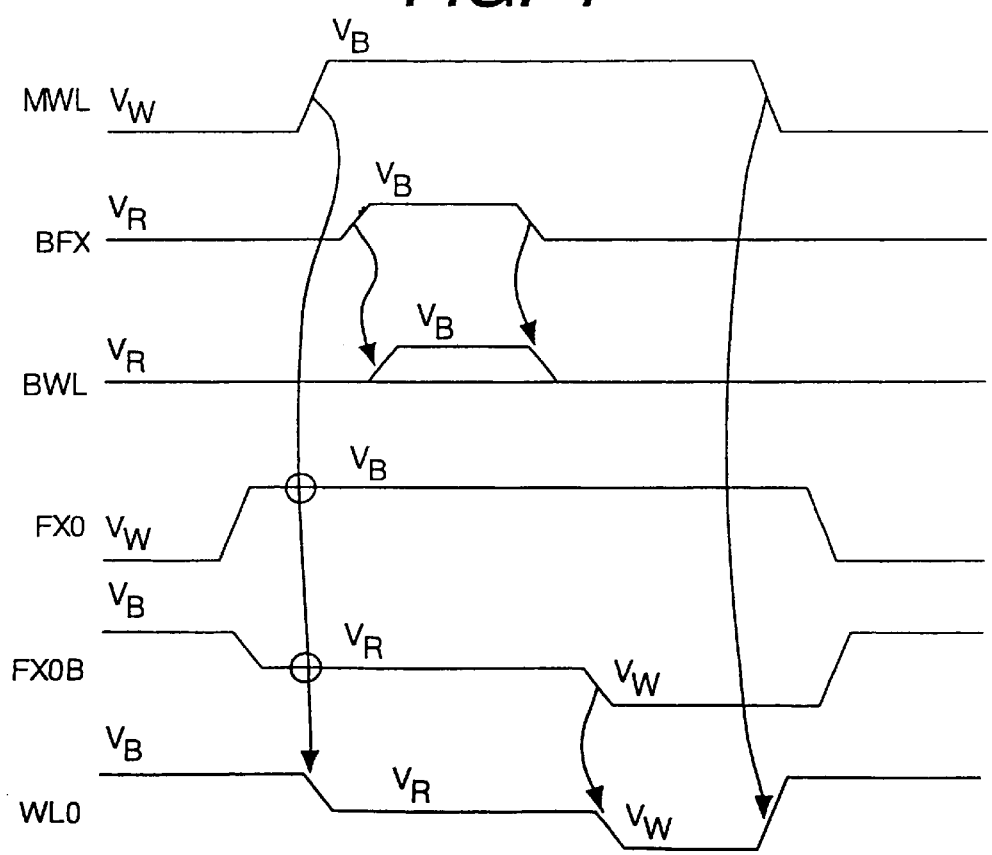
FIG. 7 is a timing chart of the operation of the sub-word driver shown in FIG. 6.

The operation of the sub-word driver of FIG. 6 will be described in accordance with FIG. 7. FIG. 7 shows the case that the sub-word driver SWD0 drives the wordline WL0.

At standby, the selection signal line FX0 and the main wordline MWL are at the write wordline voltage VW and the selection signal line FX0B is at the standby wordline voltage VB. In the sub-word driver SWD0, the transistor MW0 is in the off state, the transistors MW1 and MW2 are in the on state, and the wordline WL0 is at the standby wordline voltage VB. In the block selection line driver BSWD, the transistors MW3 and MW6 are in the off state, the transistors MW4 and MW6 are in the on state, and the block selection line BWL is at the read wordline voltage VR.

In operation, the selection signal line FX0 rises at the standby wordline voltage VB and the transistor MW2 is off in the sub-word driver SWD0. The selection signal line FX0B applies the read wordline voltage VR to the source of the transistor MW0 in the sub-word driver SWD0. The main wordline MWL is at the standby wordline voltage VB. Then, the transistor MW1 is off in the sub-word driver SWD0, the transistor MW0 is on, and sub-wordline SWL0 is driven at the read wordline voltage VR.

In the block selection line driver BSWD, the transistors MW3 and MW6 are on and the transistors MW4 and MW6 are off. The control signal BFX is at the standby wordline voltage VB. The block selection line BWL is driven at the standby wordline voltage VB. When the control signal BFX returns to the read wordline voltage VR, the block selection line BWL also returns to the read wordline voltage VR. The selection signal line FX0B is at the write wordline voltage VW so that the sub-word line SWL0 is driven at the write wordline voltage VW.

When the main wordline MWL returns to the write wordline voltage VW, the transistor MW1 is on and the transistor MW0 is off in the subword driver SWD0. The sub-wordline SWL0 is driven at the standby wordline voltage VB. The selection signal line FX0 is at the write wordline voltage VW and the selection signal line FX0B is at the standby wordline voltage VB to return to the standby state.

As described above, the structure of FIG. 6 can realize driving of the wordline and the block selection line realizing the memory cell operation shown in FIG. 2. In this structure, selection of the sub-word driver and selection of the block selection line driver are performed by the same main wordline MWL. The number of the main wordlines is small and the wiring pitch for the main wordline on the sub-array can be large. The wiring pitch is released to improve the yield. Otherwise, a power source line is arranged between the main wordlines to provide a higher S/N ratio and high speed.

Figure 8:
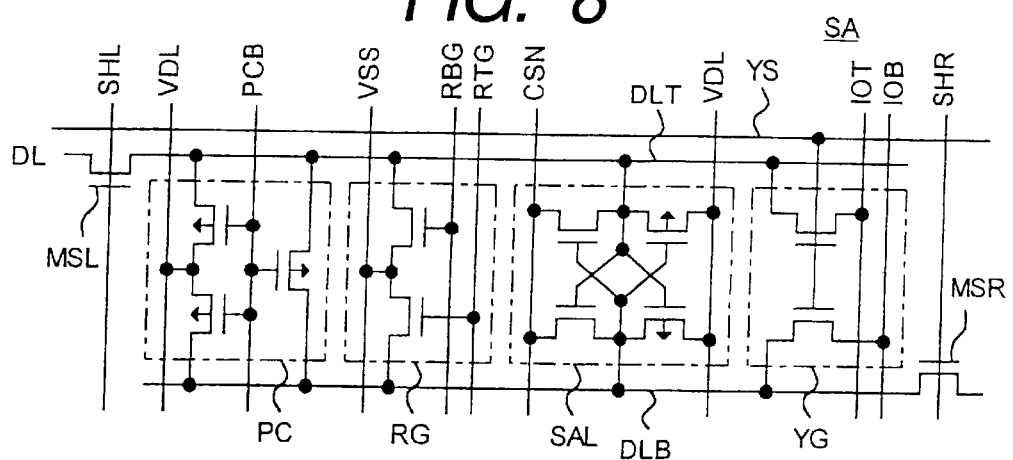
FIG. 8 is a circuit diagram showing a structure example of a sensing amplifier shown in FIG. 5.

FIG. 8 shows a structure example of the sensing amplifier SA in FIG. 5. The sensing amplifier is shared by the data line of two sub-arrays. The sensing amplifier SA is provided with isolation transistors MSL and MSR and has a pre-charge circuit PC having three PMOS transistors, a reference signal generation part RG having two NMOS transistors, a latch type differential amplifier SAL having two NMOS transistors and two PMOS transistors, and a column gate YG having two NMOS transistors controlled by a column selection line YS and connecting an input/output line pair IOT, IOB. The gate width and the gate length of the transistors of the reference signal generation circuit RG are determined so as to flow an electric current which is almost half of the signal current of the memory cell block.

Figure 9:
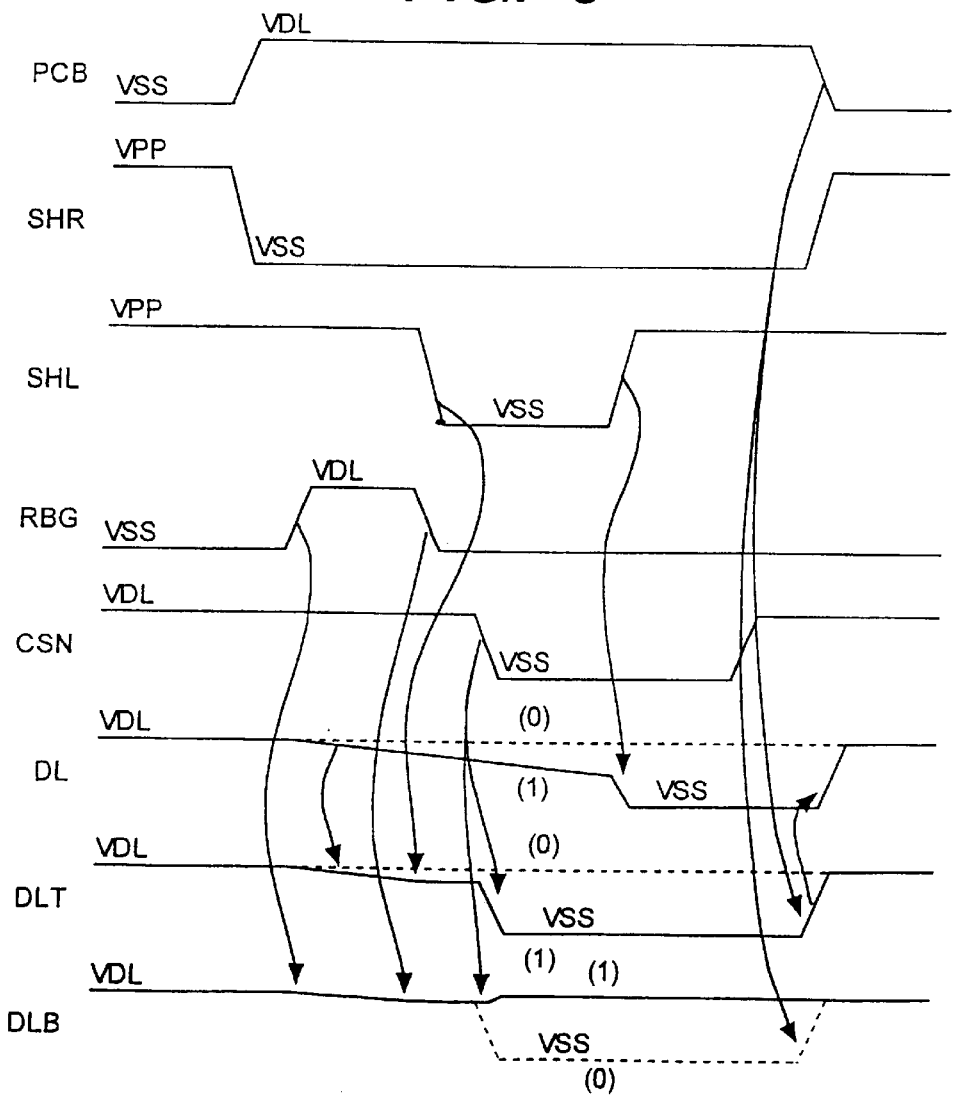
FIG. 9 is a timing chart showing the operation of the sensing amplifier shown in FIG. 8.

The operation of the sensing amplifier SA shown in FIG. 8 will be described in accordance with FIG. 9. A pre-charge control signal PCB is at the high level VDL. The PMOS transistors in the pre-charge circuit PC are off and the nodes DLT, DLB in the sensing amplifier are floating. A shared control signal SHR is at the low level VSS. The transistor MSR is off to isolate the sensing amplifier from the data line of the adjacent non-selection sub-array. As shown in FIG. 2, the signal current is read from the memory cell block to discharge the data line DL and the node DLT. Along with it, a reference signal control signal RBG is at the high level so that the transistors in the reference signal generation circuit RG discharges the node DLB.

After a voltage difference necessary for sensing appears in the nodes DLT, DLB, the shared control signal SHL is at the low level VSS. Then, the transistor MSL is off to isolate the data line DL from the node DLT, and the reference signal control signal RBG is at the low level so that the reference signal generation part RG is off. A common source CSN is at the low level, and then, the differential amplifier SAL positive-feedback-amplifies the nodes DLT, DLB to the high level VDL and the low level VSS. The sensing operation is thus completed.

Although not shown in FIG. 8, the column selection line YS is at the high level, the column gate YG is on, and signal transmission/reception is performed between the node DLT, DLB and the input/output line pair IOT and IOB. The shared control signal SHL is returned to a voltage VPP which is sufficiently higher than the high level VDL. Then, the transistor MSL is turned on and re-writing from the node DLT to the data line DL is performed. The voltage VPP can also be the same as the standby wordline voltage VB.

At reset, the common source CSN is returned to the high level VDL to stop the operation of the differential amplifier SAL. The pre-charge control signal PCB is returned to the low level to pre-charge the nodes DLT, DLB to the high level VDL. The shared control signal SHR is returned to the high voltage VPP to re-connect the data line of the adjacent non-selection sub-array to the sensing amplifier.

In the above operation, the reference signal is generated as an electric current flowing from the transistor. The voltage difference of the nodes DLT, DLB is increased with time so that the timing margin is large. At start of the operation of the latch type differential amplifier SAL, the data line DL is isolated from the sensing amplifier SA to prevent a difference in load capacitance by the data line capacitance. The load capacitance is lowered to permit a high-speed amplification operation. The memory cell block MCT shown in FIG. 1 has an amplification function in the memory cell and can be operated without providing the sensing amplifier for each data line. The sensing amplifier latches data to realize the synchronous type memory as shown in FIG. 3 operating the column system at high speed.

Embodiment 2

Figure 10:
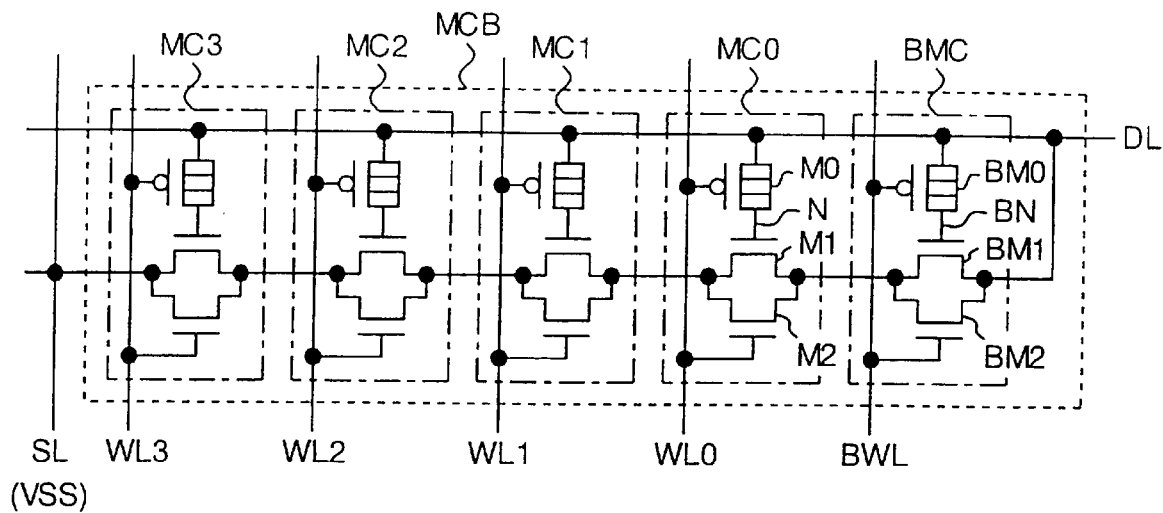
FIG. 10 is a diagram showing a structure example of memory cells of Embodiment 2.

FIG. 10 shows an example of another memory cell structure according to the present invention. A low leak transistor of a three-dimensional structure as described in the reference 3 is used. As in the memory cell structure shown in FIG. 1, four memory cells MC0–MC3 are one memory cell block MCB. Each of the memory cells has a PMOS transistor M0 for writing, an NMOS transistor M1 for reading, and a non-selection transistor M2. The low leak transistor of a three-dimensional structure is used as the PMOS transistor M0 for writing.

In place of the block selection transistor MB in FIG. 1, a block selection cell BMC is provided. As in the memory cells MC1–MC3, the block selection cell BMC has a PMOS transistor BM0 for writing, an NMbS transistor BM1 for reading, and an NMOS transistor BM2 for non-selection and is controlled by the block selection line BWL. In the memory cell structure manufacturing process described later, the block selection cell BMC of the same structure as the memory cell can be manufactured more easily than only the block selection transistor.

A normal operation including reading and writing operations is performed as shown in FIG. 2 as in the memory cell structure shown in FIG. 1. The block selection line BWL is at the read wordline voltage VR and the read transistor BM1 in the block selection cell BMC is off. This memory cell structure requires an operation determining a storage node BN in the block selection cell BMC besides the normal operation, which is performed as shown in FIG. 11.

The data line DL is changed from the normal pre-charge voltage VDL to the low level VSS. The block selection line BWL is changed from the read wordline voltage VR to the write wordline voltage VW. The storage node BN in the block selection cell BMC is at a voltage ΔV raised from the low level VSS due to leak and is returned to the low level VSS. The block selection line BWL is returned to the read wordline voltage VR to return the data line DL to the pre-charge voltage VDL. In the above order, the data line DL and the block selection line BWL are controlled to prevent wasteful charge or discharge of the storage node BN.

In the structure example of the sub-word driver block SWDB shown in FIG. 6, the voltage of the power source line to which the read wordline voltage VR is applied is temporarily at the write wordline voltage VW, and the block selection line driver BSWD drives the block selection line BWL at the write wordline voltage VW not by the main wordline MWL. In the sensing amplifier SA shown in FIG. 8, the pre-charge control line PCB is at the high level VDL to turn off the pre-charge circuit PC and the reference signal control lines RGB, RBT are at the high level VDL to turn on two transistors of the reference signal generation part RG, so that the data line DL can be at the low level VSS.

Figure 11:
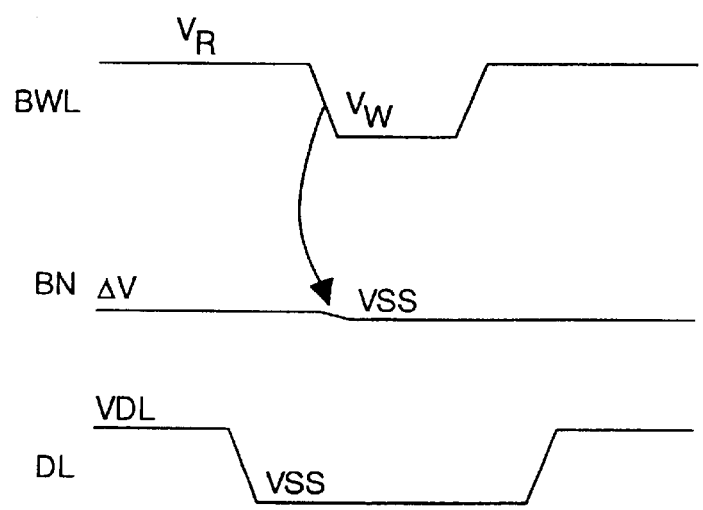
FIG. 11 is a timing chart showing the writing operation of a block selection cell shown in FIG. 10.

The operation shown in FIG. 11 can be realized without complicating the structures of the sub-word driver block SWDB and the sensing amplifier SA. A great number of memory cell blocks in the memory array can perform the operation together. The overhead which cannot perform the normal operation of the memory array is small.

Figure 12:
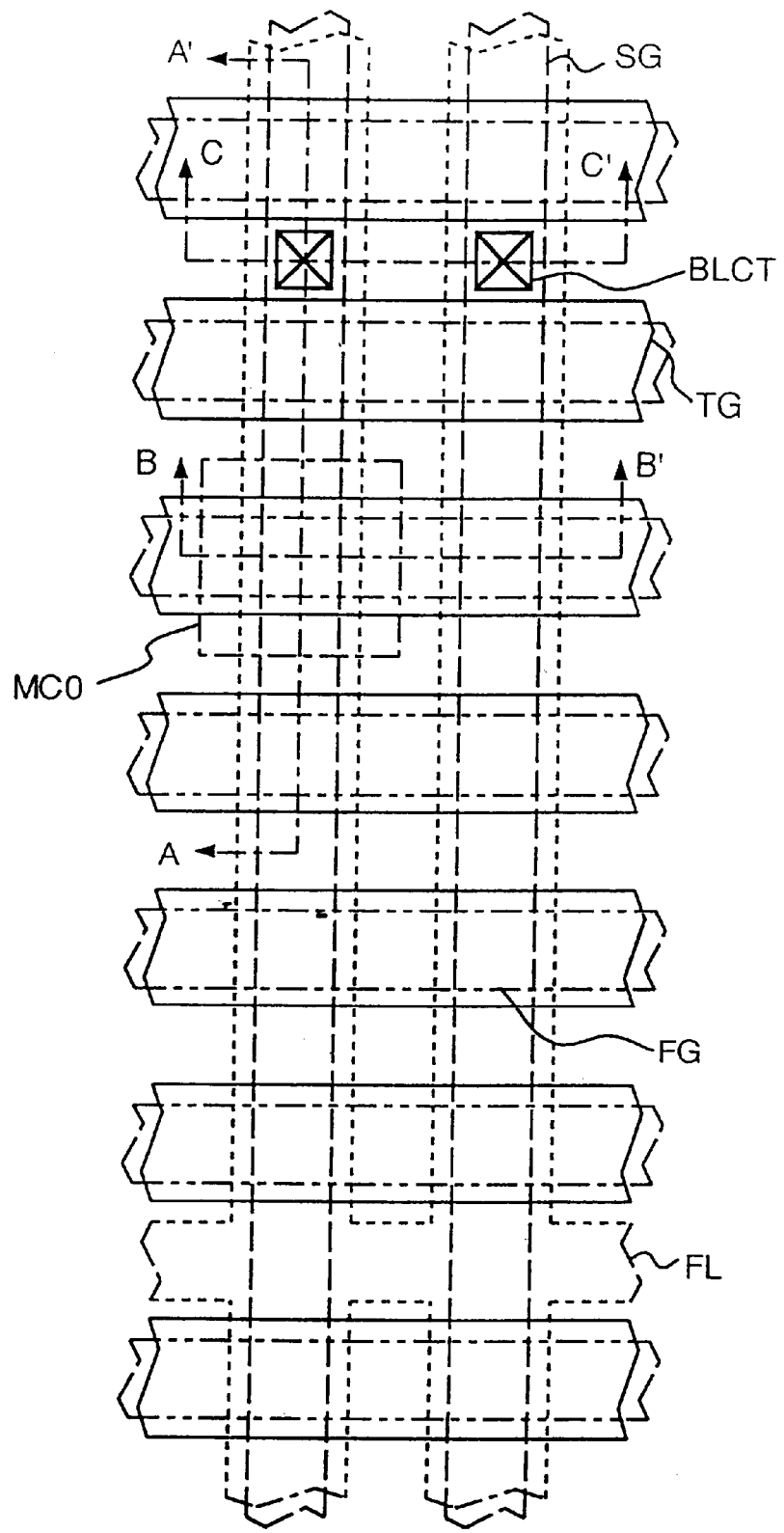
FIG. 12 is a diagram showing a layout of the memory cell of the Embodiment 2.

An example of the structure of the memory cell block MCB shown in FIG. 10 will be described. FIG. 12 shows a layout. In the drawing, FL denotes an active region pattern; FG, a polysilicon processing pattern for determining the region of the node N in FIG. 10; SG, a data line pattern; TG, a wordline pattern; and BCLT, a data line contact pattern. A known photolithography can be used for pattering of these patterns.

Figure 13:
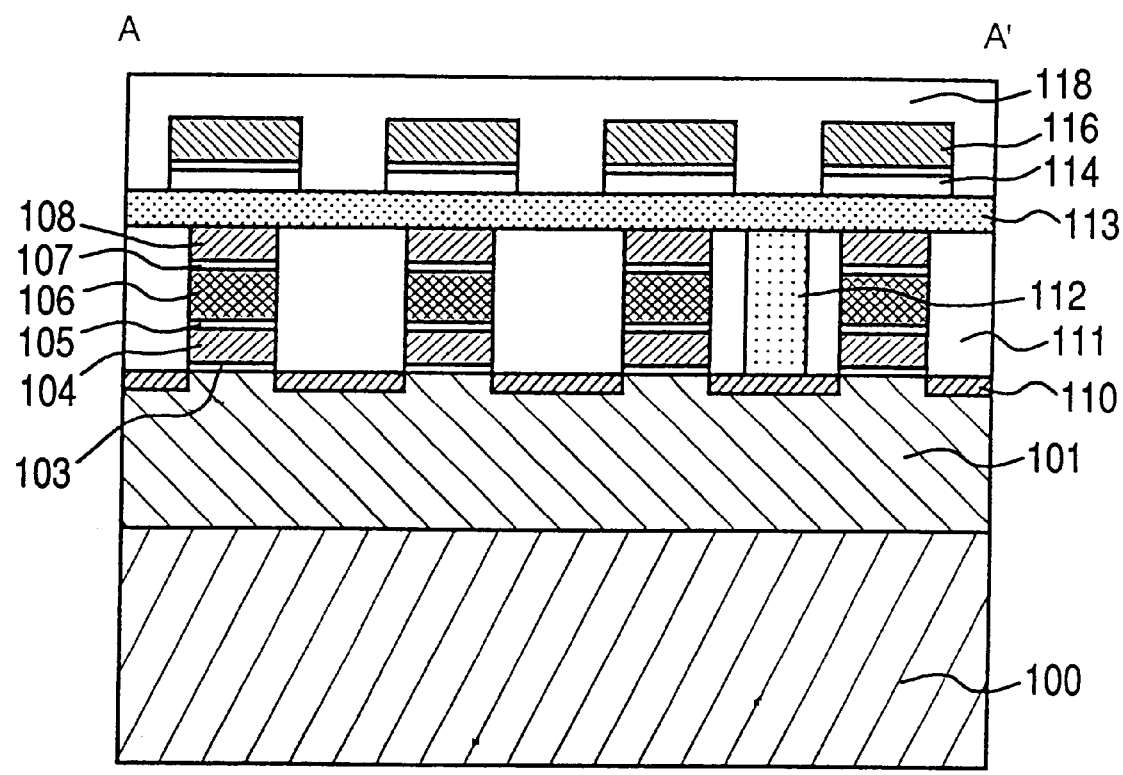
FIG. 13 is a cross-sectional view showing a memory cell structure of a part taken along line A–A' shown in the layout of FIG. 12.
Figure 14:
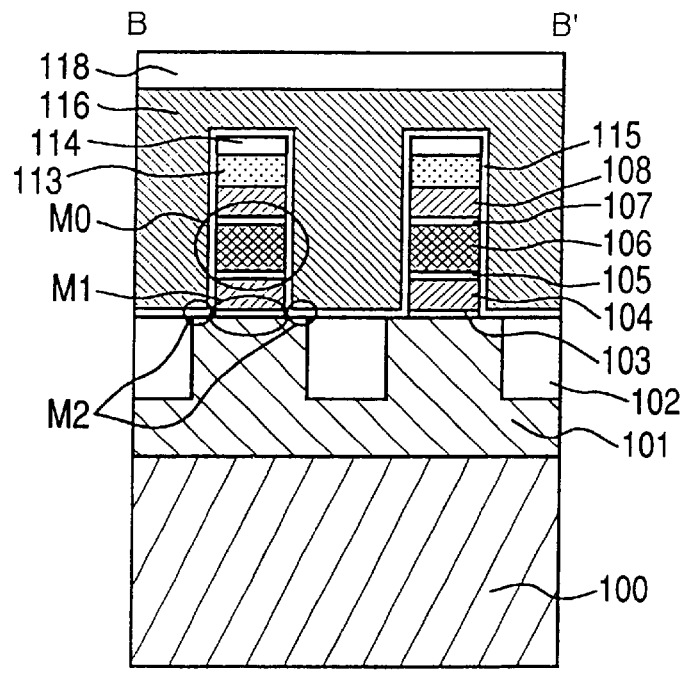
FIG. 14 is a cross-sectional view showing the memory cell structure of a part taken along line B–B' shown in the layout of FIG. 12.
Figure 15:
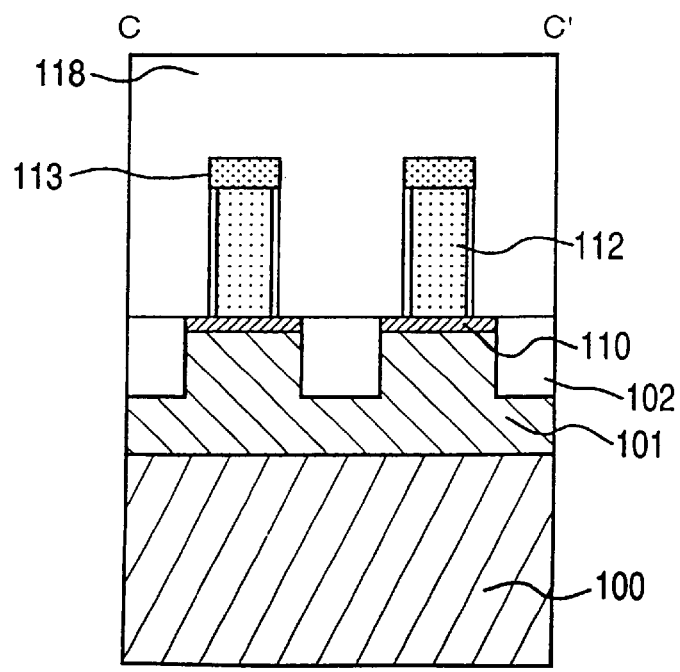
FIG. 15 is a cross-sectional view showing the memory cell structure of a part taken along line C–C' shown in the layout of FIG. 12.

FIG. 13 shows a cross-sectional view of a part taken along line A–A' shown in FIG. 12 (hereinafter called an A–A' cross-section). FIG. 14 shows a cross-sectional view of a part taken along line B–B' shown therein (hereinafter called a B–B' cross-section). FIG. 15 shows a cross-sectional view of a part taken along line C–C' shown therein (hereinafter called a C–C' cross-section). In these drawings, the numeral 100 denotes a semiconductor substrate; the numeral 101, a p-type well; the numeral 102, an isolation oxide film; the numeral 103, a-gate oxide film of the read transistor M1; the numeral 104, p-type polysilicon as the node N in FIG. 10; the numeral 105, a lower nitride film of the transistor M0 in FIG. 10; the numeral 106, intrinsic polysilicon into which no impurities are doped; the numeral 107, an upper nitride film of the transistor M0; the numeral 108, p-type polysilicon as the source/drain terminal of the transistor M0 in FIG. 10; the numeral 110, an n-type diffusion layer; the numeral 111, an interlayer oxide film; the numeral 112, a data line contact; the numeral 113, a data line; the numeral 114, an interlayer oxide film; the numeral 115, a gate oxide film of the write transistor M0; the numeral 116, n-type polysilicon as the wordline; and the numeral 118, an interlayer oxide film.

As shown in FIG. 14, three transistors of the memory cell are integrated by a three-dimensional structure to make the area small. The write transistor M0 is of a vertical type structure in which the p-type polysilicon 104, 108 as the source/drain terminal interpose the intrinsic polysilicon 106 as the channel region and a source/drain path is formed in the direction vertical to the semiconductor substrate. The gate oxide film 115 and the gate of the n-type polysilicon 116 are configured on the sidewall. The p-type polysilicon 104, 108 and the intrinsic polysilicon 106 interpose a nitride film as the diffusion barrier film. The accepter can be prevented from being diffused into the intrinsic polysilicon 106 to sufficiently lower the impurity density in the intrinsic polysilicon. This can realize a completely depleted transistor in which the entire channel region is depleted at OFF, thereby lowering the leak current.

The read transistor M1 and the non-selection transistor M2 are connected in parallel and have the common source and drain. The gates of the transistors M1, M2 are made separately to be formed without the isolation region. The plane area can be thus small. The transistor M2 is provided on both sides of the transistor M1, as shown in FIG. 14. When the gate part of the transistor M1 is shifted from the active region due to mask misalignment, the total gate width of the transistor M2 has a small variation. The matching margin need not be large. The read transistor M1 and the non-selection transistor M2 are integrated to be adjacent. An electric field from the gates of both contributes to channel forming.

Although not shown in the equivalent circuit in FIG. 10, only the gate oxide film 115 is provided between the polysilicon 104 and 116. A coupling capacitance is formed between the wordline and the storage node N. The coupling capacitance varies the voltage of the storage node N when driving the wordline. In consideration of this, the threshold voltage of the transistors in the memory cell may be determined. In the direction in which the voltage of the storage node N is raised at non-selection and the read transistor is on, the resistance of the unselected memory cell as the read signal current path is lowered to increase the signal current.

The semiconductor substrate 100 may be of p-type or n-type and be also of a triple well structure having a n-type deep well provided under the p-type well 101. Depending whether the well of the read transistor M1 and the non-selection transistor M2 of the memory cell and the well of the MOS transistor of a peripheral circuit divide a voltage or not, various well structures may exist. For example, in the structure of the memory array part as shown in FIG. 4, when using the sub-word driver shown in FIG. 6, the p-type well as a body of the NMOS transistor MW0 in the sub-word driver must be at below the write wordline voltage VW. The n-type well as a body of the PMOS transistors MW1, MW2 must be at above the standby wordline voltage VB. Using the triple well so that the voltages are not applied to the body of the transistors of the peripheral circuit is effective in high speed.

In accordance with FIGS. 16 to 25, the manufacturing process of the memory cell structures shown in FIGS. 14 and 15 will be described. To manufacture the peripheral circuit at the same time, processes not shown here, for example, forming the n-type well as the body of PMOS and forming the p-type diffusion layer are performed whenever necessary.

Figure 16:
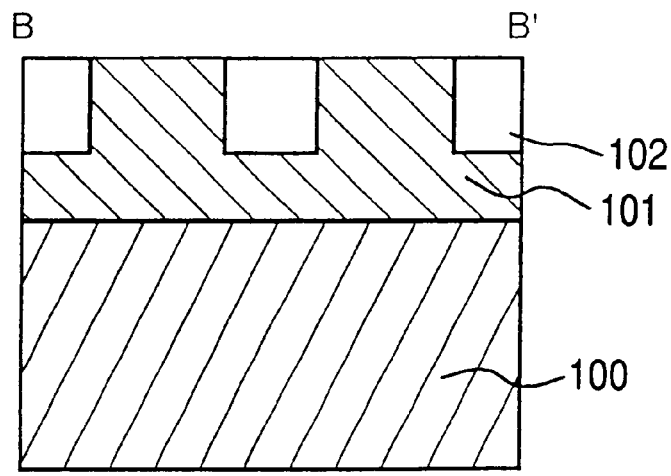
FIG. 16 is a B–B' cross-sectional view showing a manufacturing process (1) of the memory cell of Embodiment 2.
Figure 17:
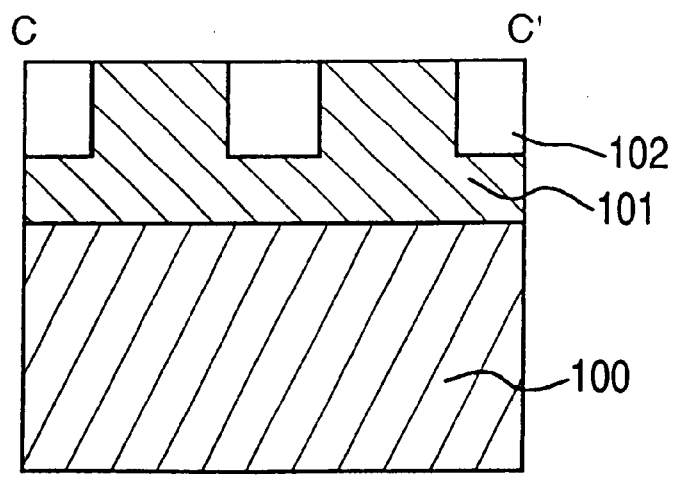
FIG. 17 is a C–C' cross-sectional view showing the manufacturing process (1) of the memory cell of Embodiment 2.

As shown in FIGS. 16 and 17, the p-type well 101 is formed on the semiconductor substrate 100 to form the isolation oxide film 102. In this state, the B–B' cross-section and the C–C' cross-section are of the same structure. To reduce the isolation region, effectively, an oxide film surface vertical to the substrate 100 can be made by a known trench isolation method. Specifically, the p-type well 101 is etched by the active region pattern FL to dig a channel, which is then buried by the oxide film for flattening by chemical mechanical polishing (CMP).

Figure 18:
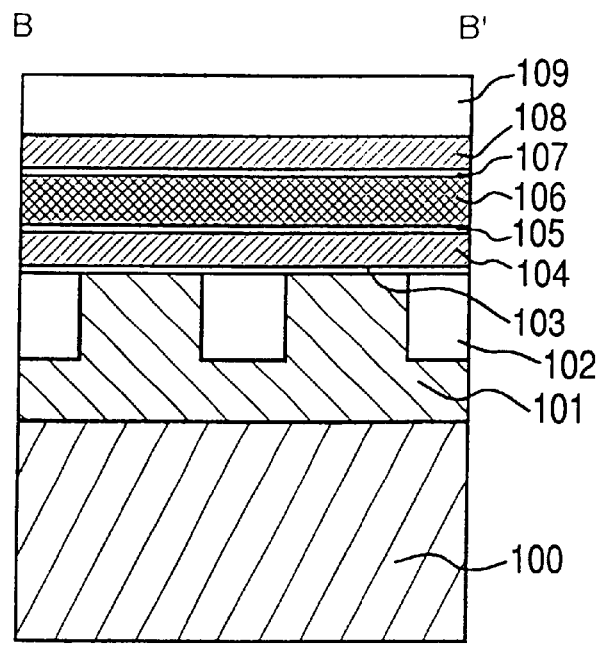
FIG. 18 is a B–B' cross-sectional view showing a manufacturing process (2) of the memory cell of Embodiment 2.
Figure 19:
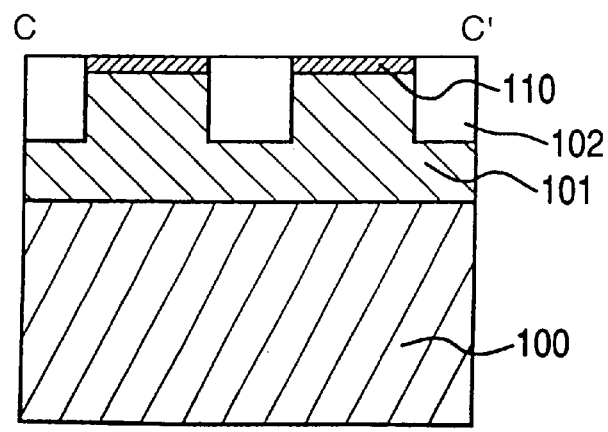
FIG. 19 is a C–C' cross-sectional view showing the manufacturing process (2) of the memory cell of Embodiment 2.

As shown in FIG. 18, contamination of the surface along with ion implantation is removed to form the gate oxide film 103. The p-type polysilicon 104, the nitride film 105, the intrinsic polysilicon 106, the nitride film 107, the p-type polysilicon 108 and the nitride film 109 are deposited sequentially, by a known chemical vapor deposition (CVD). These are etched by the polisilicon processing pattern FG. The B–B' cross-section is covered by the pattern FG and the deposited layers remain. As shown in FIG. 19, these are removed in the C–C' cross-section without the pattern FG. The n-type diffusion layer 110 is formed using a known ion implantation method. The n-type diffusion layer can be made of silicide. This increases the number of processes to lower the resistance of the diffusion layer. The diffusion layer made of silicide can lower the resistance of the source line SL in FIG. 10 to increase the signal current. It is effective to prevent variation of the signal current by the pattern dependence of the memory cell selected by the same wordline.

Figure 20:
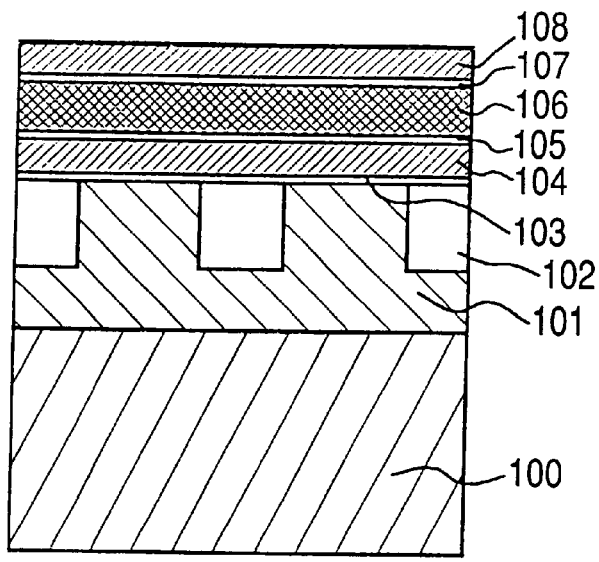
FIG. 20 is a B–B' cross-sectional view showing a manufacturing process (3) of the memory cell of Embodiment 2.
Figure 21:
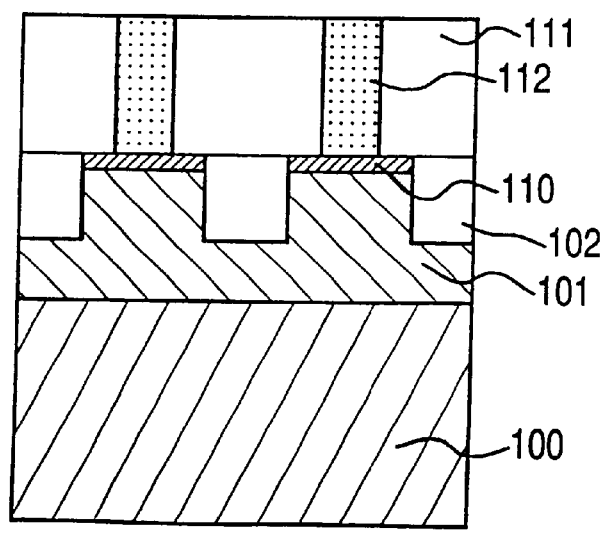
FIG. 21 is a C–C' cross-sectional view showing the manufacturing process (3) of the memory cell of Embodiment 2.

As shown in FIGS. 20 and 21, the interlayer oxide film 111 is buried to be flattened by CMP. It is etched by the data line contact pattern BLCT to open a connection hole which is buried by barrier metal of titanium nitride and metal of tungsten, thereby forming the data line contact 112. The data line contact can be formed by polysilicon. The resistance can be reduced using metal to increase the read signal current. In CMP, the nitride film 109 shown in FIG. 18 serves as a stopper to remove the remaining nitride film 109.

Figure 22:
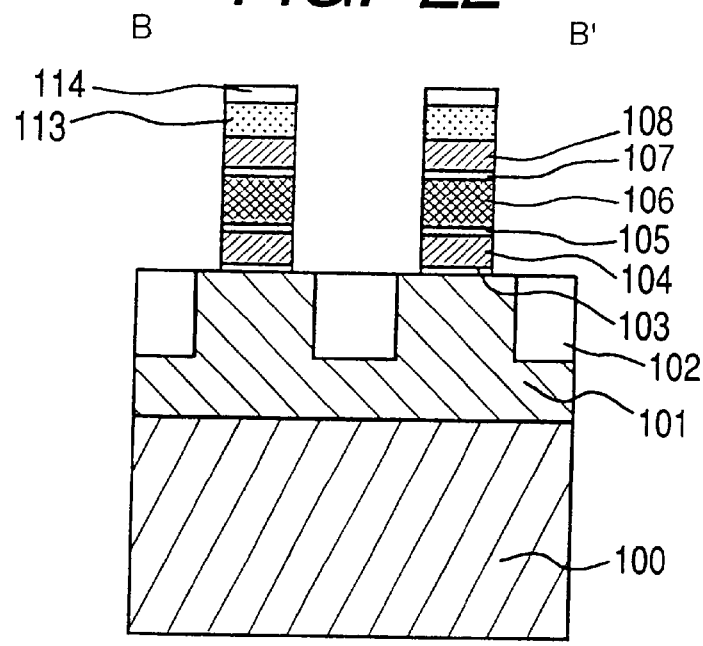
FIG. 22 is a B–B' cross-sectional view showing a manufacturing process (4) of the memory cell of Embodiment 2.
Figure 23:
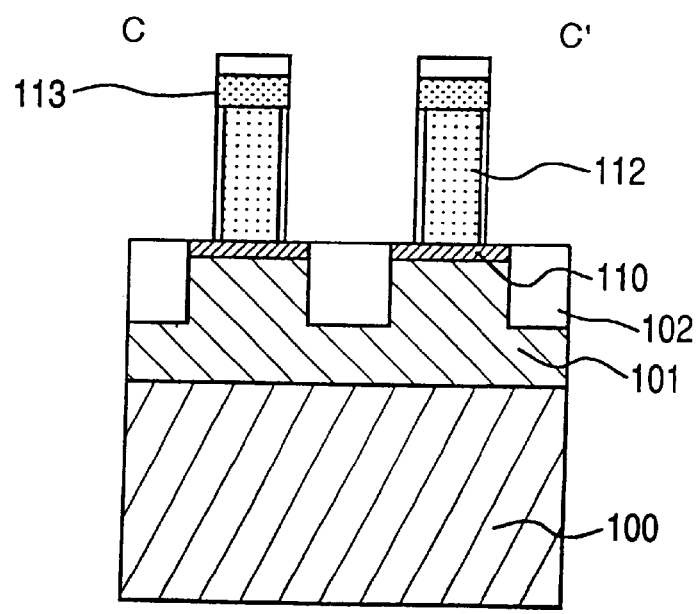
FIG. 23 is a C–C' cross-sectional view showing the manufacturing process (4) of the memory cell of Embodiment 2.

As shown in FIGS. 22 and 23, the metal wiring layer 113 as the data line and the interlayer oxide film 114 are deposited by CVD. Etching is performed down to the gate oxide film 103 by the data line pattern SG. The polysilicon 104, 106, 108 are etched by the data line pattern SG to form, in a self alignment manner, the storage node N as the source/drain terminal of the write transistor M0 and the gate of the read transistor M1.

Figure 24:
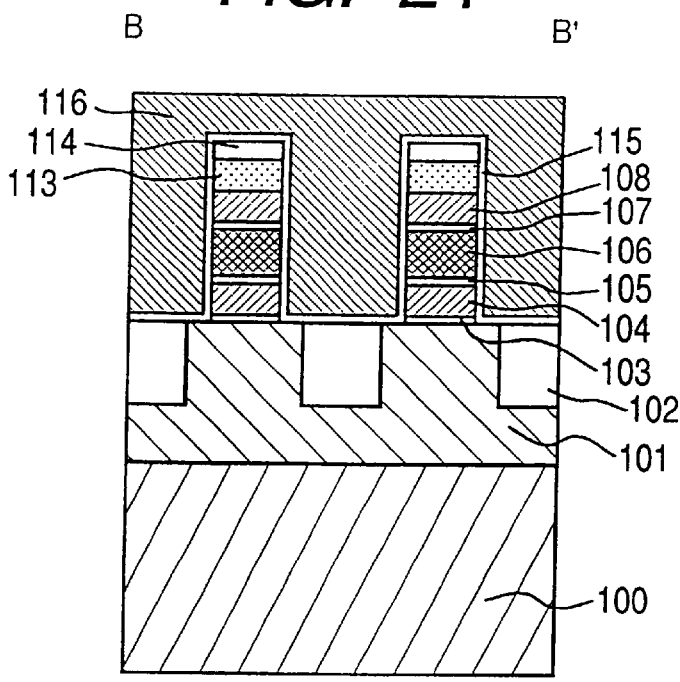
FIG. 24 is a B–B' cross-sectional view showing a manufacturing process (5) of the memory cell of Embodiment 2.
Figure 25:
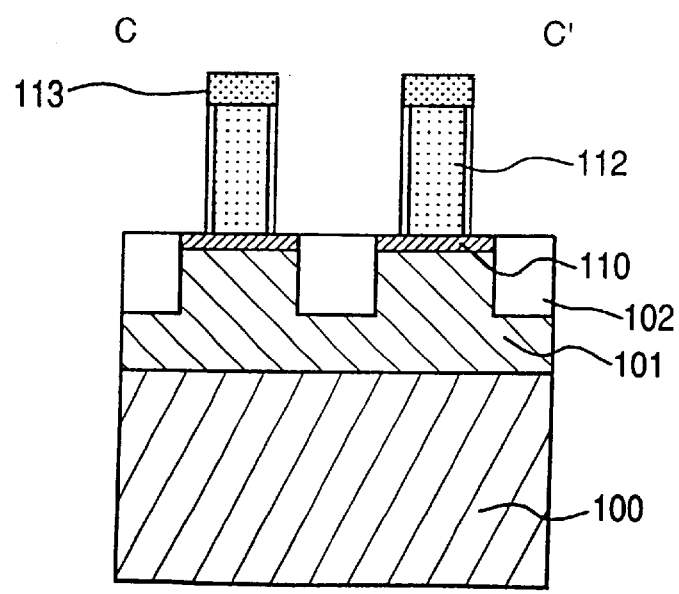
FIG. 25 is a C–C' cross-sectional view showing the manufacturing process (5) of the memory cell of Embodiment 2.

As shown in FIG. 24, the thin oxide film 115 of about 5 to 10 nm as the gate oxide film of the write transistor M0 and the non-selection transistor M2 is formed by CVD to deposit the polysilicon layer 116 as the wordline by CVD. At this time, metal can also be deposited on the polysilicon layer 116. The number of processes is increased to lower the resistance of the wordline to realize a high-speed operation. It is etched by the wordline pattern TG. The B–B' cross-section is covered by the pattern TG. The deposited polysilicon layer 116 remains. As shown in FIG. 25, it is removed in the C–C' cross-section without the pattern TG. The interlayer insulator film 118 is deposited to realize the structures shown in FIGS. 14 and 15.

Embodiment 3

The memory cell structure according to the present invention is not limited to the structure shown Embodiment 2 and can be of another memory cell structure. This embodiment is of the same memory cell structure of FIG. 10 as that of Embodiment 2 and has the layout shown in FIG. 12 and the A–A' cross-section shown in FIG. 13. The B–B' cross section and the C–C' cross-section will be described.

Figure 26:
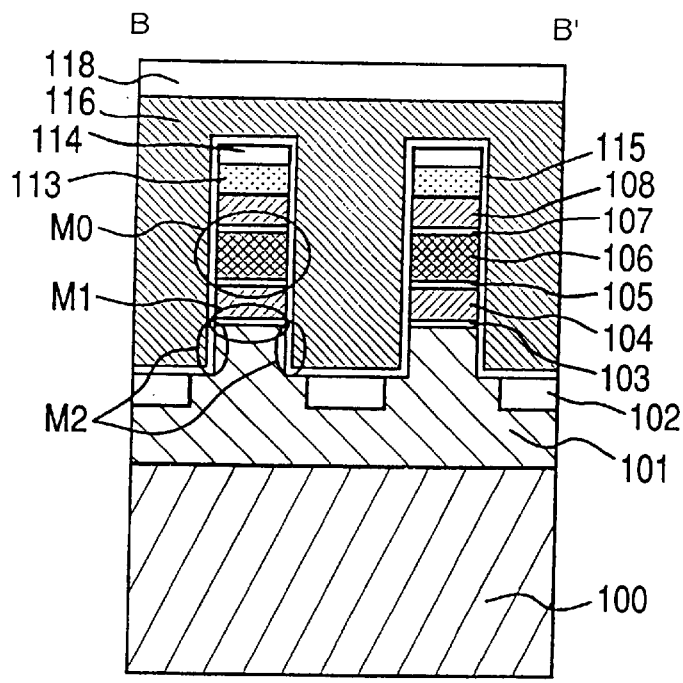
FIG. 26 is a diagram showing the structure of a memory cell of Embodiment 3 and a cross-sectional view of the part taken along line B–B' of FIG. 12.
Figure 27:
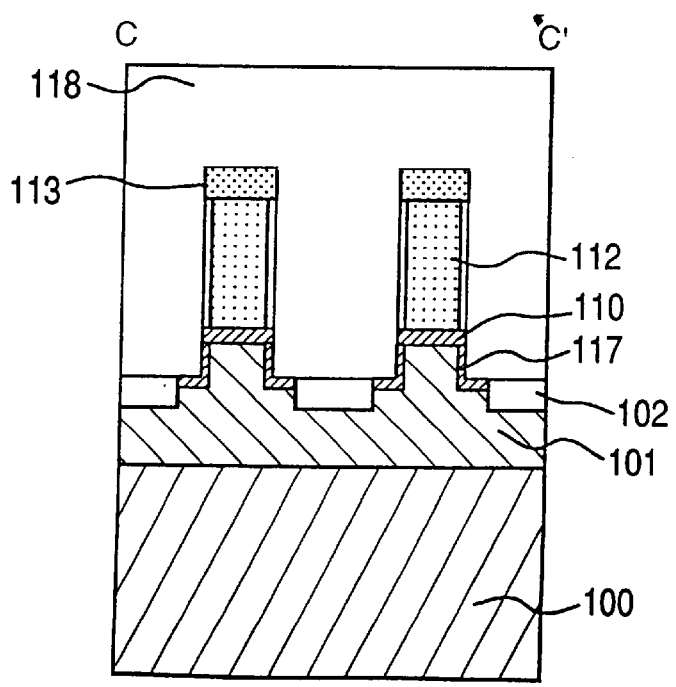
FIG. 27 is a diagram showing the structure of the memory cell of Embodiment 3 and a cross-sectional view of the part taken along line C–C' of FIG. 12.

FIG. 26 shows the B–B' cross-section and FIG. 27 shows the C–C' cross-section. As in Embodiment 2, the semiconductor substrate 100 denotes a semiconductor substrate; the numeral 101, a P-type well; the numeral 102, an isolation oxide film; the numeral 103, a gate oxide film for the read transistor M1; the numeral 104, p-type silicon as the node N in FIG. 10; the numeral 105, a lower nitride film of the transistor M0 in FIG. 10; the numeral 106, intrinsic polysilicon; the numeral 107, an upper nitride film of the transistor M0; the numeral 108, p-type polysilicon as the source/drain terminal of the transistor M0 in FIG. 10; the numeral 110, an n-type diffusion layer; the numeral 112, a data line contact; the numeral 113, a data line; the numeral 114, an interlayer oxide film; the numeral 115, a gate oxide film of the write transistor M0; the numeral 116, n-type polysilicon as the wordline; and the numeral 118, an interlayer oxide film.

In the structure of this embodiment, the semiconductor substrate is etched to be convex and the non-selection transistor M2 is provided on the side wall. The gate width of the non-selection transistor M2 can be increased sufficiently without increasing the plane area.

Figure 28:
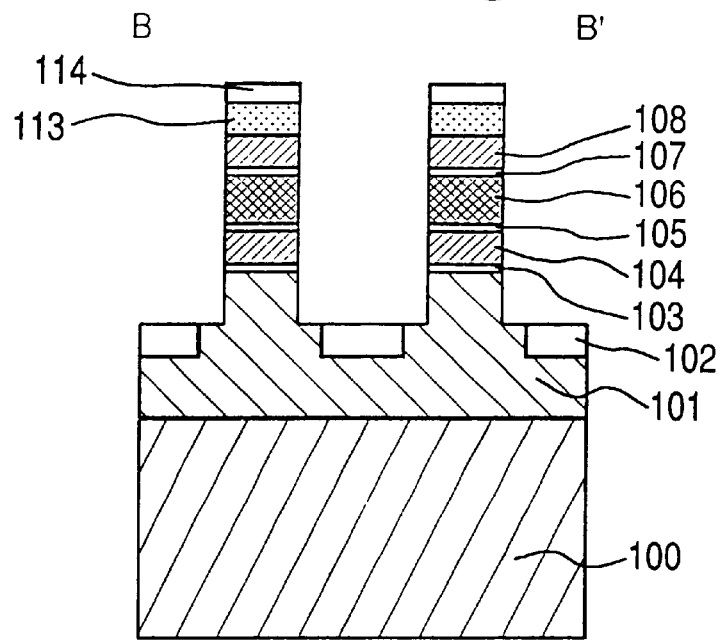
FIG. 28 is a B–B' cross-sectional view showing a manufacturing process (4) of the memory cell of Embodiment 3.
Figure 29:
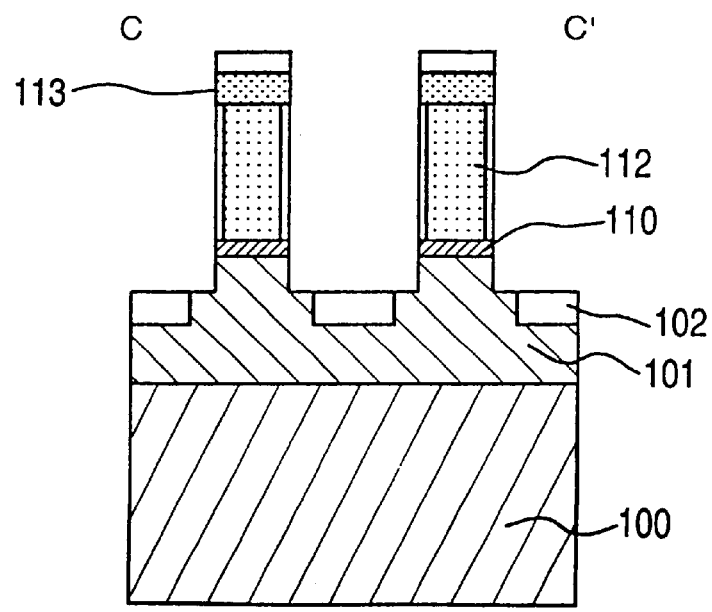
FIG. 29 is a C–C' cross-sectional view showing the manufacturing process (4) of the memory cell of Embodiment 3.

The structure of this embodiment can be realized by the following manufacturing process. As in Embodiment 2, the data line contact 112 is formed as shown in FIGS. 16 to 21. As shown in FIGS. 28 and 29, the metal wiring layer 113 as the data line and the interlayer oxide film 114 are deposited by CVD. Etching is performed, by the data line pattern SG, partway through the isolation oxide film 102 more deeply than the gate oxide film 103. The n-type diffusion layer 110 not covered by the data line pattern SG is removed.

Figure 30:
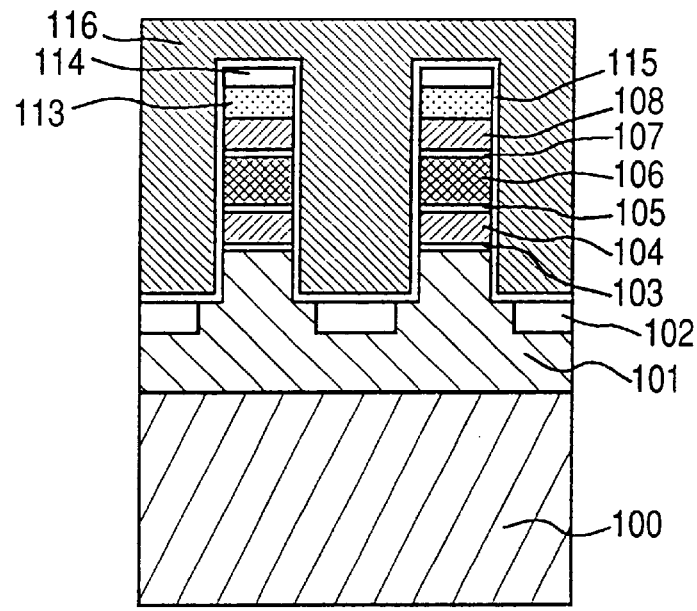
FIG. 30 is a B–B' cross-sectional view showing a manufacturing process (5) of the memory cell of Embodiment 3.
Figure 31:
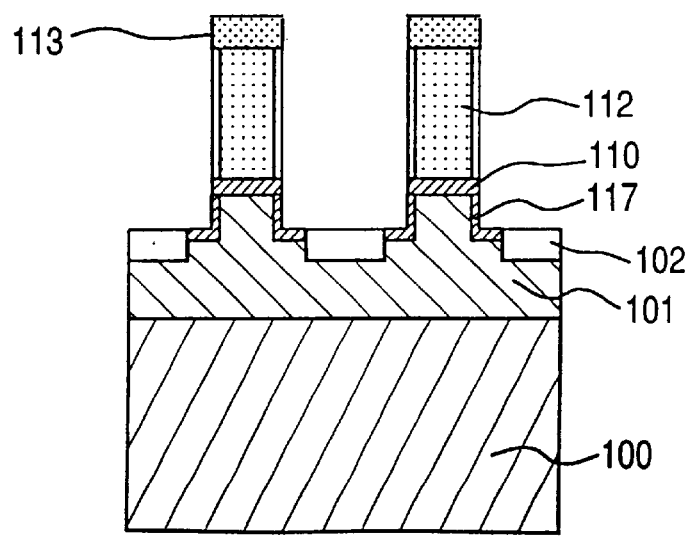
FIG. 31 is a C–C' cross-sectional view showing the manufacturing process (5) of the memory cell of Embodiment 3.

As shown in FIGS. 30 and 31, the gate oxide film 115 is formed by CVD. The polysilicon layer 116 as the wordline is deposited by CVD to be etched by the wordline pattern TG. The n-type diffusion layer 117 is formed again by ion implantation so as to be continuous to the part of the n-type diffusion layer 110 formed in FIG. 19. This can secure conduction of the region of the source line not covered by the data line pattern SG. The interlayer insulator film 118 is deposited to realize the structures shown in FIGS. 26 and 27.

Embodiment 4

Figure 32:
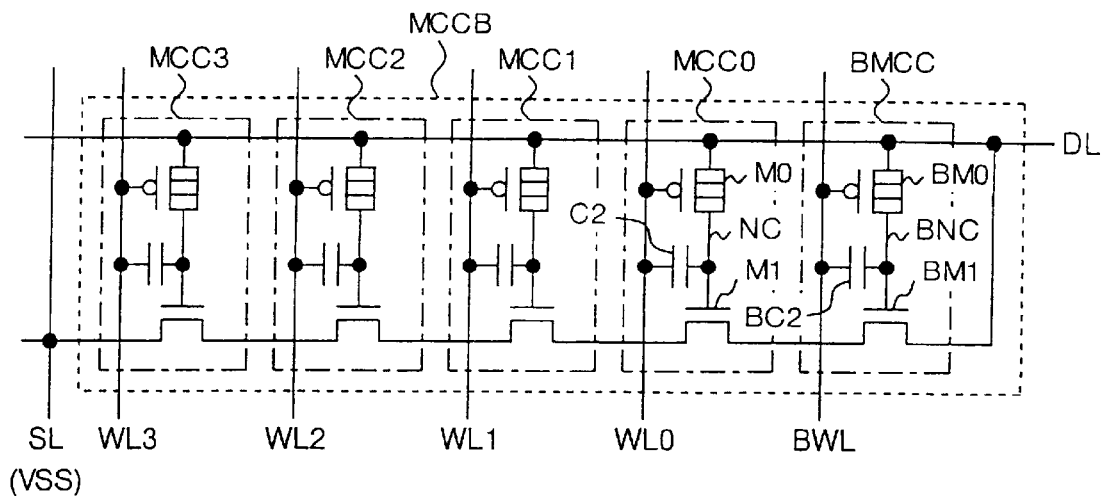
FIG. 32 is a diagram showing a structure example of a memory cell of Embodiment 4.

FIG. 32 shows another structure example of a memory cell block according to the present invention. This embodiment performs an operation by the coupling capacitance between the wordline and the storage node without providing the non-selection transistor M2 used in the memory cell structure shown in FIG. 10. Also in this embodiment, as in the memory cell structure shown in FIG. 10, four memory cells MCC0–MCC3 and a block selection cell BMCC of the same structure as the memory cell form one memory cell block MCCB. Each of the memory cells has a PMOS transistor M0 for writing, an NMOS transistor M1 for reading, and a coupling capacitance C2. A low leak transistor of a three-dimensional structure is used for the PMOS transistor M0 for writing. The block selection cell BMCC is used here. As in Embodiment 2, the block selection cell BMCC of the same structure as the memory cell is manufactured more easily than only the block selection transistor.

The operation of the memory cell structure of this embodiment will be described. The memory cell connected to the wordline WL1 is selected.

Figure 33:
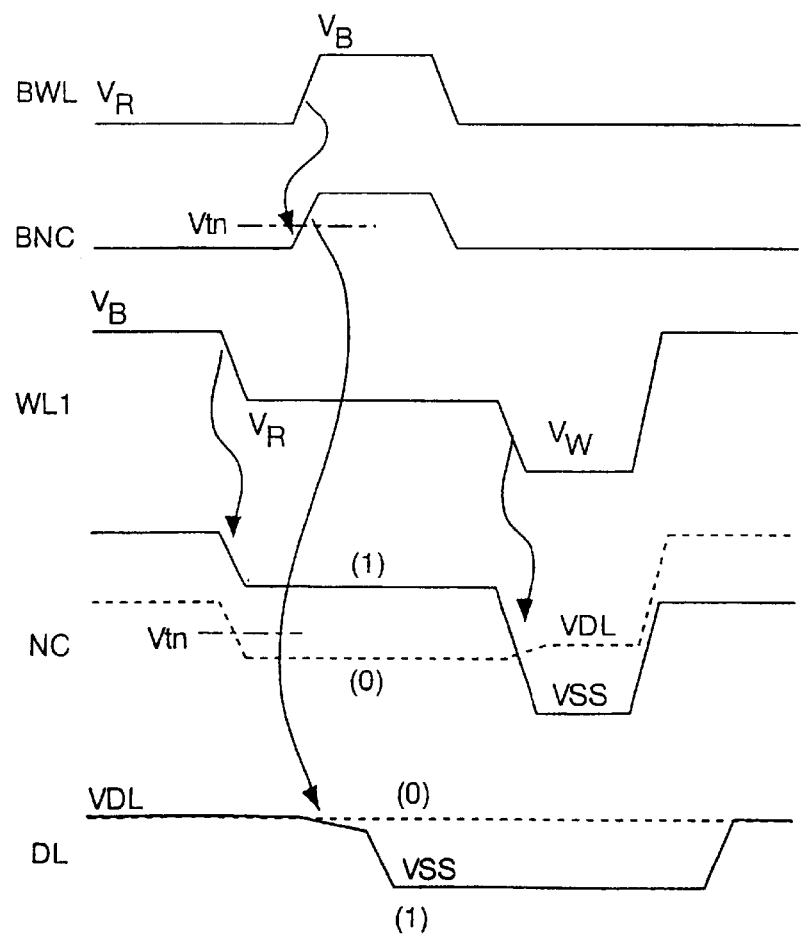
FIG. 33 is a timing chart showing the operation of the memory cell shown in FIG. 32.

The normal operation is performed as shown in FIG. 33. The wordline WL1, the block selection line BWL and the data line DL are controlled as in FIG. 2 except that voltage application from the wordline WL1 to a storage node NC is performed by the coupling capacitance C2.

In a standby state, the block selection line BWL is at the read wordline voltage VR, the transistor BM1 is in the off state in the block selection cell BMCC, and the read transistor M1 of the memory cell MCC0 is isolated from the data line DL. The wordlines WL0–WL3 are all at the high-level standby wordline voltage VB. The storage node NC is raised by the coupling capacitance C2 in the memory cells. The read transistor M1 is in the on state not by the stored information.

In operation, any one of the wordlines, in this case, the WL1 is at the read wordline voltage VR to select the memory cell MCC1. The voltage of the storage node NC is lowered in the selected memory cell by the coupling capacitance C2 and depending on the stored information, whether the read transistor M1 is in the off or on state is determined. In the other memory cells, the wordline is held at the standby wordline voltage VB and the read transistor M1 holds the on state. The block selection line BWL is at the standby wordline voltage VB. The voltage of a node BNC is raised by a coupling capacitance BC2 in the block selection cell BMCC and the transistor BM1 is on. Depending on whether the information stored in the memory cell MCC1 is '1' or '0', whether an electric current flows or not from the data line DL to the source line SL is determined. The electric current is detected to discriminate the information stored by the selected memory cell.

After completion of the sensing operation, the block selection line BWL is returned to the read wordline voltage VR. The voltage of the node BNC is lowered by the coupling capacitance BC2, and then, the transistor BM1 is off to shut off the current path. The selection wordline WL1 is at the write wordline voltage VW. The write transistor M0 is on in the selected memory cell MCC1, and then, the voltage of the data line DL is applied to the storage node N to write information into the memory cell. The selection wordline WL1 is returned to the standby wordline voltage VB. The write transistor M0 is off in the selected memory cell MCC1. The storage node NC is raised by the coupling capacitance C2 to complete the writing operation.

As in Embodiment 2, the block selection line BWL is at the read wordline voltage VR and the read transistor BM0 in the block selection cell BMCC is off. The control as shown in FIG. 11 determines the node BNC of the block selection cell BMCC.

The coupling capacitance is used in this embodiment. The same operation is permitted without using the non-selection transistor as used in Embodiments 1 to 3. The control is the same as Embodiment 2. The memory can be configured as shown in Embodiment 1.

Figure 34:
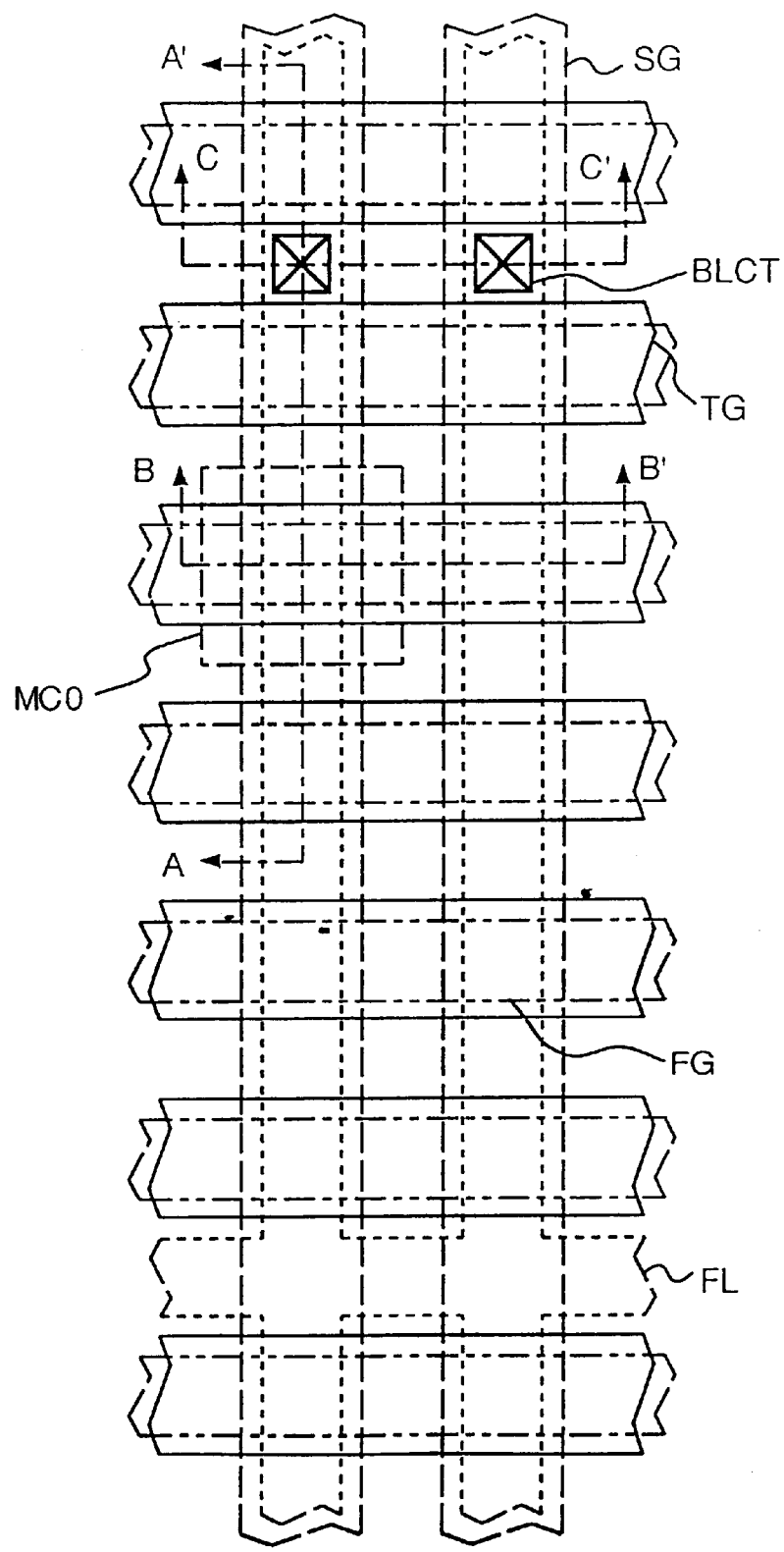
FIG. 34 is a diagram showing a layout of the memory cell of Embodiment 4.

An example of the structure of the memory cell block of this embodiment will be described. FIG. 34 shows a layout. As in FIG. 12, FL denotes an active region pattern; FG, a polysilicon processing pattern; SG, a data line pattern; TG, a wordline pattern; and BLCT, a data line contact pattern.

Figure 35:
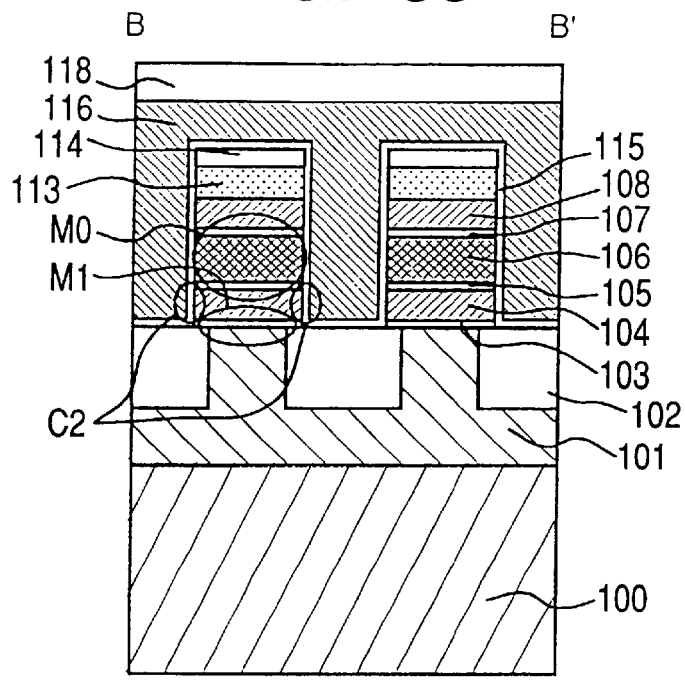
FIG. 35 is a cross-sectional view showing a memory cell structure of a part taken along line B–B' shown in the layout of FIG. 34.
Figure 36:
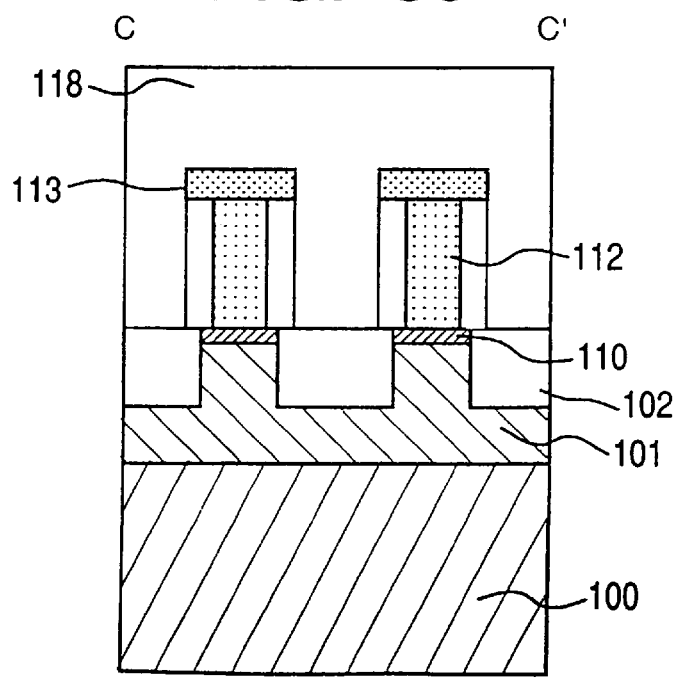
FIG. 36 is a cross-sectional view showing the memory cell structure of a part taken along line C–C' shown in the layout of FIG. 34.

The A–A' cross-section in the layout is the same as the structure shown in FIG. 13. FIG. 35 shows the B–B' cross-section. FIG. 36 shows the C–C' cross-section. The reference numerals of these drawings are the same as those of FIGS. 13 to 15. The numeral 100 denotes a semiconductor substrate; the numeral 101, a p-type well; the numeral 102, an isolation oxide film; the numeral 103, a gate oxide film for the read transistor M1; the numeral 104, p-type polysilicon as the node NC in FIG. 32; the numeral 105, a lower nitride film of the transistor M0 in FIG. 32; the numeral 106, intrinsic polysilicon; the numeral 107, an upper nitride film of the transistor M0; the numeral 108, p-type polysilicon as the source/drain terminal of the transistor M0 in FIG. 32; the numeral 110, an n-type diffusion layer; the numeral 111, an interlayer oxide film; the numeral 112, a data line contact; the numeral 113, a data line; the numeral 114, an interlayer oxide film; the numeral 115, a gate oxide film of the write transistor M0; the numeral 116, n-type polysilicon as the wordline; and the numeral 118, an interlayer oxide film.

The structure of this embodiment can be realized by the manufacturing process as described using FIGS. 16 to 25. The coupling capacitance C2 is automatically configured on the side wall of the polysilicon 104 as the storage node NC. The capacitance value of the capacitance C2 can be adjusted by varying the thickness when depositing the polysilicon 104. The layout shown in FIG. 34 is different from FIG. 12 in that the common region of the wordline pattern TG and the active region pattern FL are covered by the data line pattern SG. As shown in the B–B' cross-section of FIG. 35, the polysilicon 104 as the gate of the read transistor M1 extends onto the isolation oxide film 102. The gate capacitance of the read transistor M1 is reduced to increase the influence of the coupling capacitance C2. The position of the gate is shifted from the channel part due to misalignment between the masks. The gate capacitance can be prevented from being varied.

Embodiment 5

Figure 37:
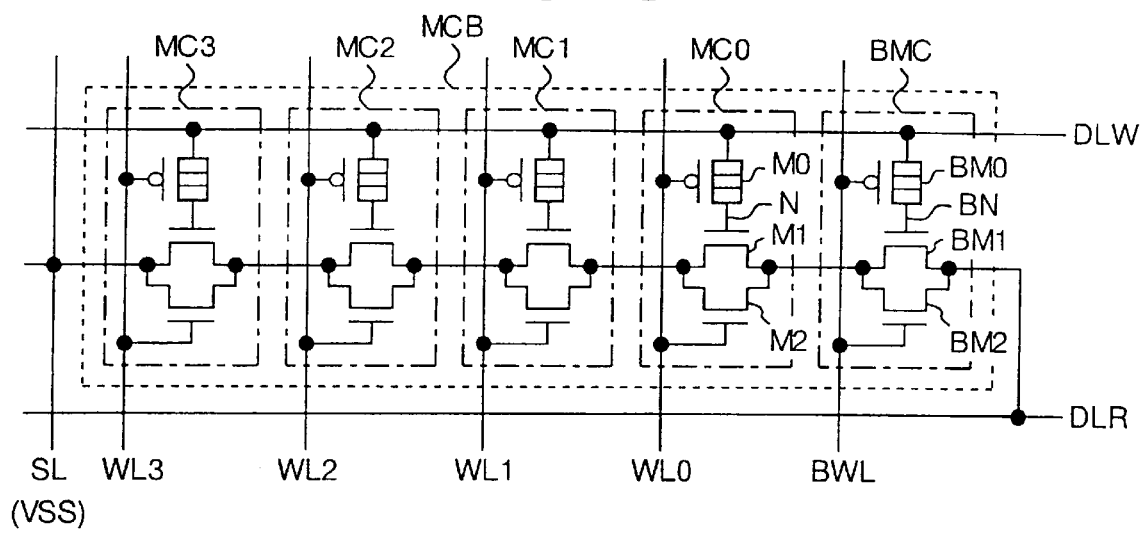
FIG. 37 is a diagram showing a structure example of a memory cell of Embodiment 5.

FIG. 37 shows a further example of a memory cell structure according to the present invention. The data line is isolated for writing and reading. As in FIG. 10, the memory cell block MCB has four memory cells MC0–MC3 and a block selection cell BMC, but they are connected to a write data line DLW Band a read data line DLR.

Figure 38:
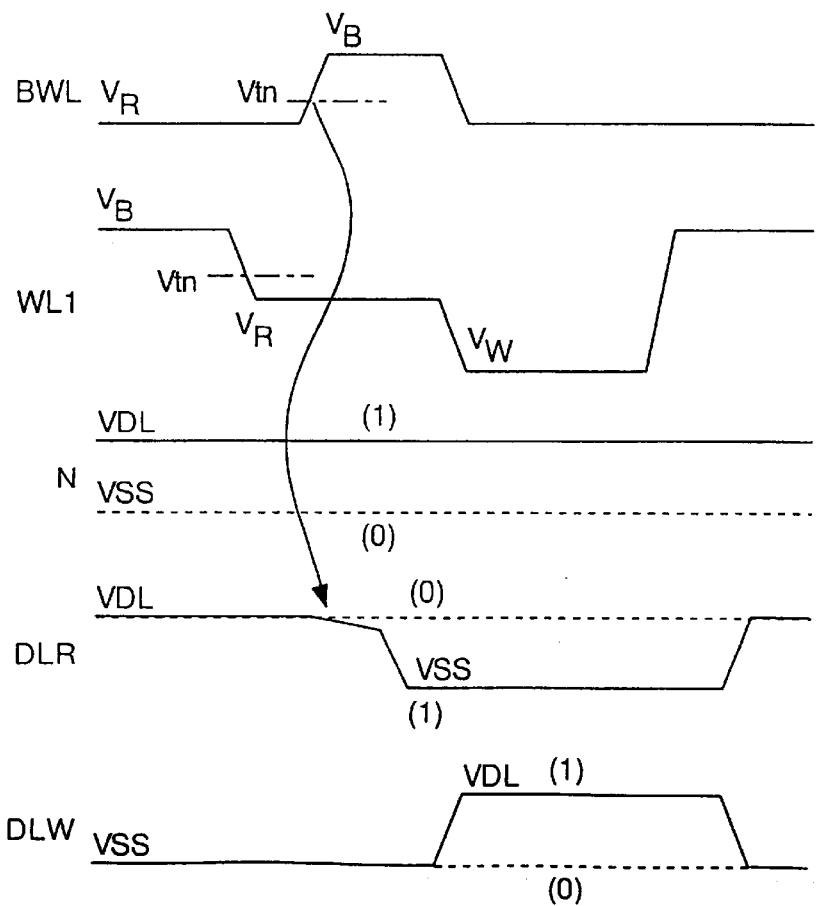
FIG. 38 is a timing chart showing the operation of the memory cell shown in FIG. 37.

The normal operation is performed as shown in FIG. 38. The memory cell connected to the wordline WL1 is selected. The wordline WL1 and the block selection line BWL are controlled as in FIG. 2. As in Embodiment 2, when the block selection line BWL is at the read wordline voltage VR, the read transistor BM1 in the block selection cell is off. The control shown in FIG. 11 decides the potential of the node BNC of the block selection cell BMC.

In a standby state, the block selection line BWL is at the read wordline voltage VR and the transistors BM1 and BM2 are off in the block selection cell BMC. The wordlines WL0–WL3 are all at the high-level standby wordline voltage VB. The non-selection transistor M2 is in the on state not by the stored information.

In operation, any one of the wordlines, in this case, the WL1 is at the read wordline voltage VR to select the memory cell MC1. The non-selection transistor M2 is off in the selected memory cell. The read transistor M1 decides conduction or non-conduction of the read path. In other memory cells, the wordline is held at the standby wordline voltage VB. The non-selection transistor M2 holds the ON state.

The block selection line BWL is at the standby wordline voltage VB. The transistor BM2 is on in the block selection cell BMC. As a result, according to the information of the selected memory cell MC1, whether an electric current flows or not from the read data line DLR via the memory cell block MCB to the source line SL is determined. The electric current is detected to discriminate information stored by the selected memory cell.

After completion of the sensing operation, the block selection line BWL is returned to the read wordline voltage VR, and then, the transistor BM2 is off to shut off the current path. The write data line DLW is driven according to the detected result of the read data line DLR. The selection wordline WL1 is at the write wordline voltage VW. The write transistor M0 is on in the selected memory cell MC1. The voltage of the write data line DLW is applied to the storage node N to write information into the memory cell MC1. The selection wordline WL1 is returned to the standby wordline voltage VB. The write transistor M0 is off in the selected memory cell MC1 to complete the writing operation.

This operation is different from that shown in FIG. 2. The information of the memory cell is not inverted in the reading and re-writing operations. The control is thus easy. The read data line DLR is not connected to the write transistor M1. The capacitance is small so that a high-speed reading operation can be realized. The pre-charge voltage of the write data line DLW is at the low level VSS. The voltage of the storage node N can be prevented from being increased due to the sub-threshold current of the write transistor M0 at standby.

In FIG. 38, the voltage amplitudes of the read data line DLR and the write data line DLW are the same. Another voltage amplitude is permitted. This increases flexibility to set the threshold value of the transistor in the memory cell.

Figure 39:
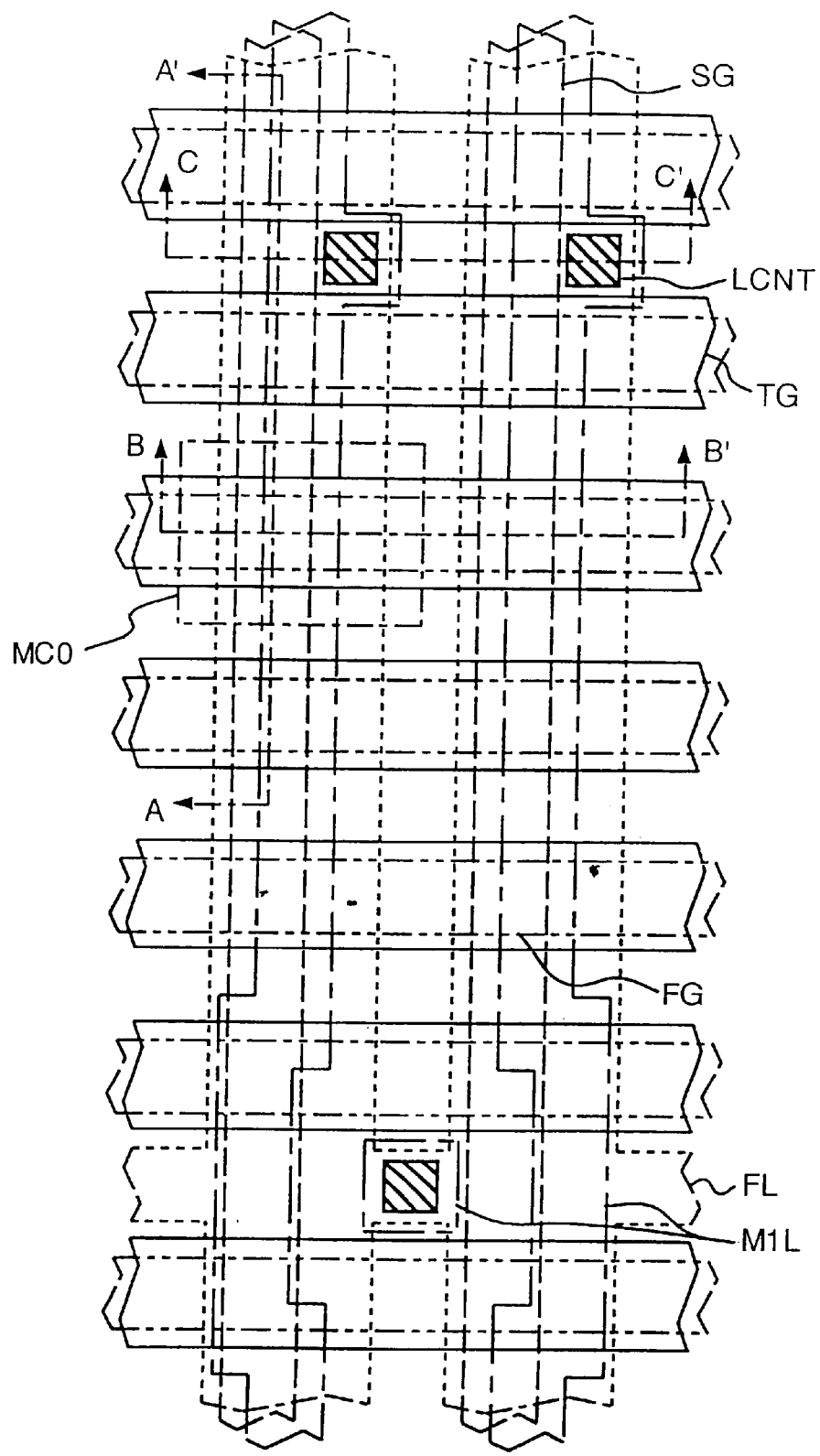
FIG. 39 is a diagram showing a layout of the memory cell of Embodiment 5.

An example of the structure of this memory cell block will be described. FIG. 39 shows a layout. In FIG. 39, FL denotes an active region pattern; FG, a polysilicon processing pattern; SG, a data line pattern when forming the write data line DLW; TG, a word line pattern; LCNT, a contact pattern; and M1L, a metal wiring pattern when forming the read data line DLR. For the contact pattern LCNT and the metal wiring pattern M1L, the same layer as a layer used in forming the peripheral circuit can be used. The number of the manufacturing processes is not increased.

Figure 40:
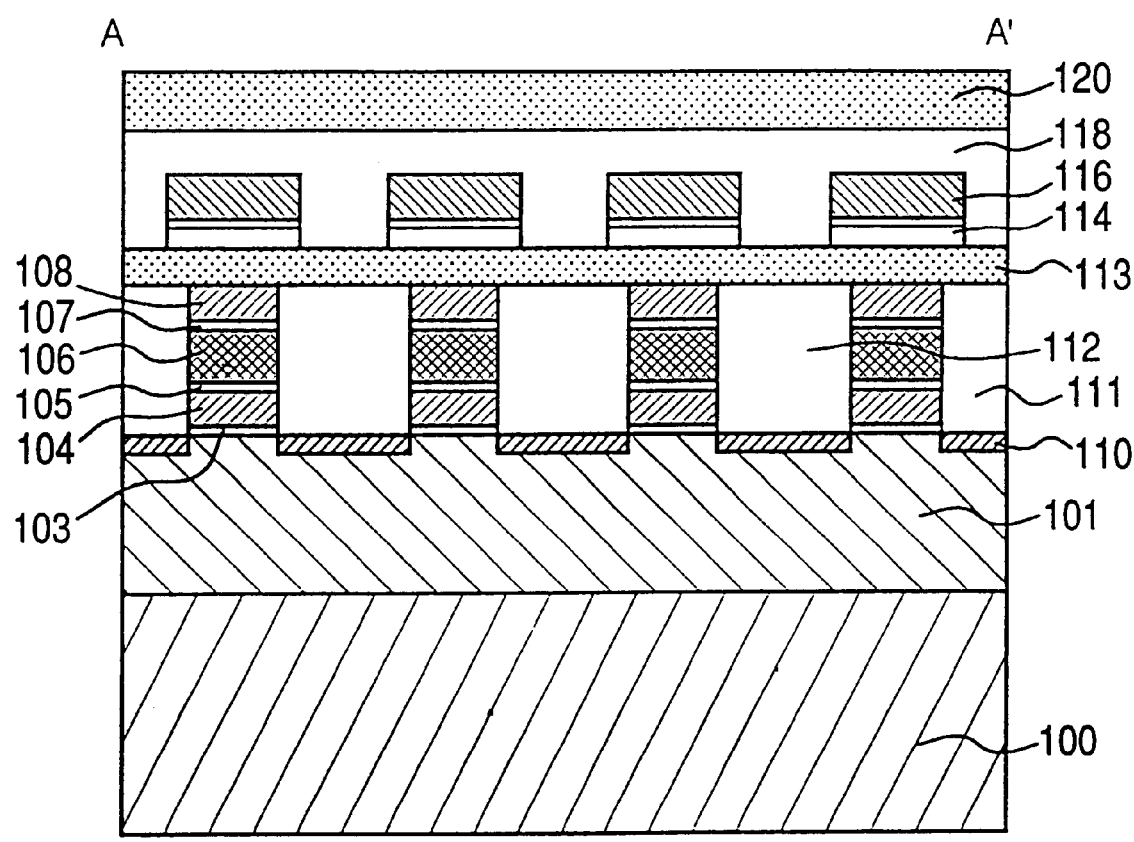
FIG. 40 is a cross-sectional view showing a memory cell structure of a part taken along line A–A' shown in the layout of FIG. 39.
Figure 41:
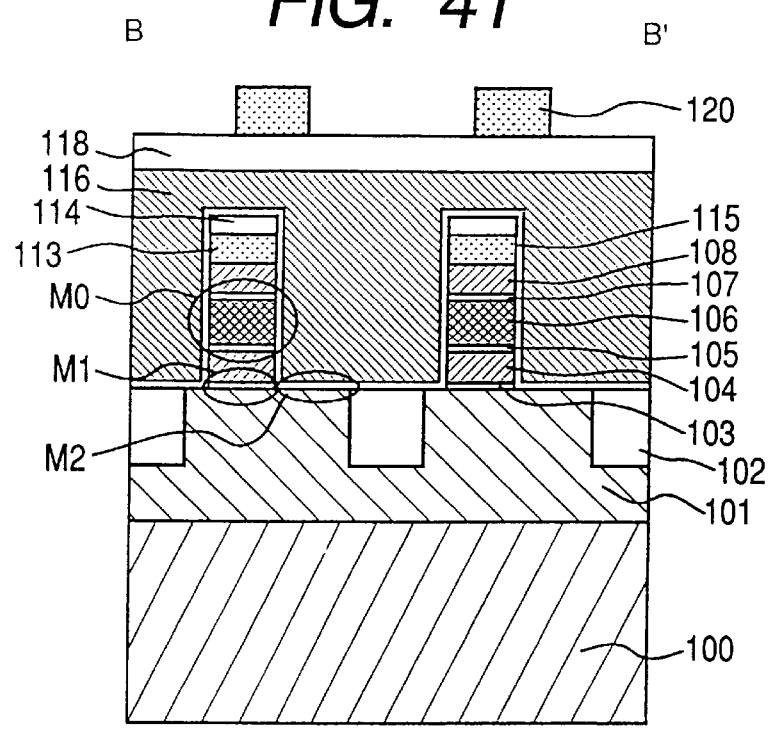
FIG. 41 is a cross-sectional view showing the memory cell structure of a part taken along line B–B' shown in the layout of FIG. 39.
Figure 42:
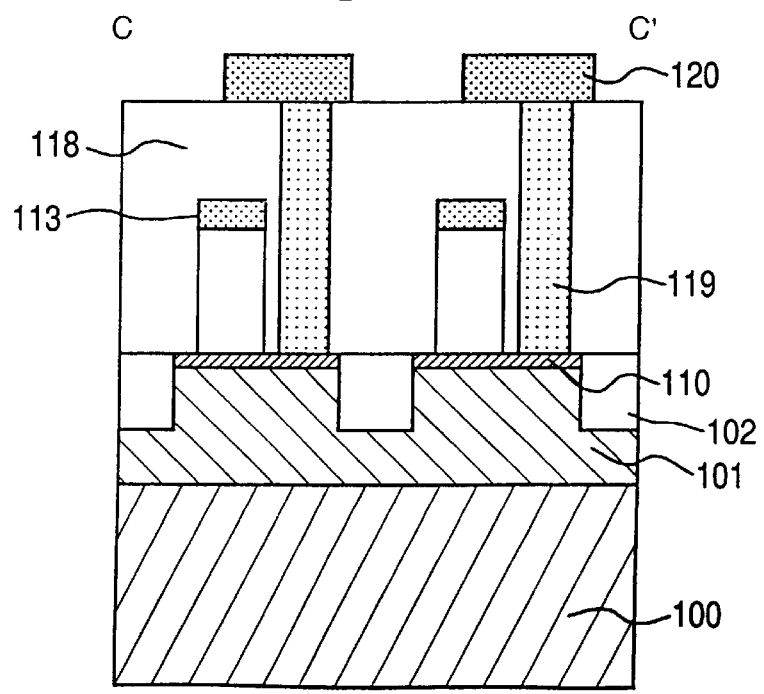
FIG. 42 is a cross-sectional view showing the memory cell structure of a part taken along line C–C' shown in the layout of FIG. 39.

FIG. 40 shows a cross-section of a part taken along line A–A' of FIG. 39 (A–A' cross-section). FIG. 41 shows a B–B' cross-section. FIG. 42 shows a C–C' cross-section. As in FIGS. 13 to 15, the numeral 100 denotes a semiconductor substrate; the numeral 101, a p-type well; the numeral 102, an isolation oxide film; the numeral 103, a gate oxide film of the read transistor M1; the numeral 104, p-type polysilicon as the node N in FIG. 37; the numeral 105, a lower nitride film of the transistor M0 in FIG. 37; the numeral 106, intrinsic polysilicon; the numeral 107, an upper nitride film of the transistor M0; the numeral 108, p-type polysilicon as the source/drain terminal of the transistor M0 in FIG. 37; the numeral 110, an n-type diffusion layer; the numeral 111, an interlayer oxide film; the numeral 113, a metal wire as the write data line; the numeral 114, an interlayer oxide film; the numeral 115, a gate oxide film of the write transistor M0; the numeral 116, n-type polysilicon as the wordline; the numeral 118, an interlayer oxide film; the numeral 119, a contact; and the numeral 120, a metal wire as the read data line.

In the memory cell structure of this embodiment, there is the contact 119 raised from the diffusion layer 110 to the metal wire 120 as the read data line DLR. The data line pitch thereof is larger than that of Embodiment 2. Exploiting it, the width of the active region pattern FL is increased to increase the gate width of the non-selection transistor M2. The on-resistance is reduced to increase the signal current. The contact 119 is provided on the diffusion layer 110 of the source line SL to be connected to the metal wire 120. The metal wire 120 is backed by the metal wire of the upper layer, not shown. The resistance of the source line SL is reduced to increase the signal current. For example, it can be wired by the same metal wiring layer as the main wordline MWL used in controlling the sub-word driver shown in FIG. 6.

Figure 43:
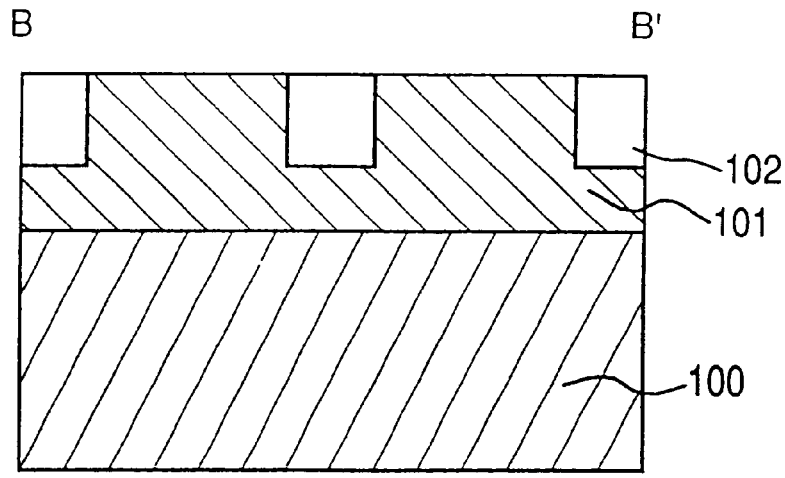
FIG. 43 is a B–B' cross-sectional view showing a manufacturing process (1) of the memory cell of Embodiment 5.
Figure 44:
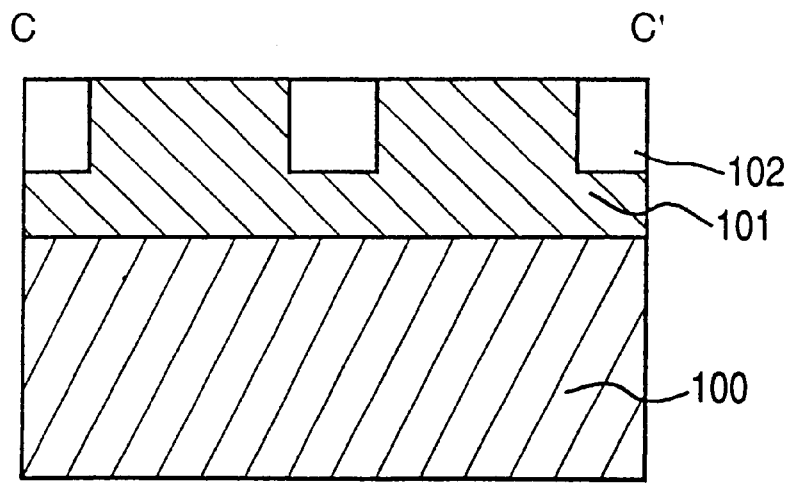
FIG. 44 is a C–C' cross-sectional view showing the manufacturing process (1) of the memory cell of Embodiment 5.

The manufacturing process of the memory cell block structure of this embodiment will be described using FIGS. 43 to 54. As shown in FIGS. 43 and 44, the p-type well 101 is formed on the semiconductor substrate 100 to form the isolation oxide film 102.

Figure 45:
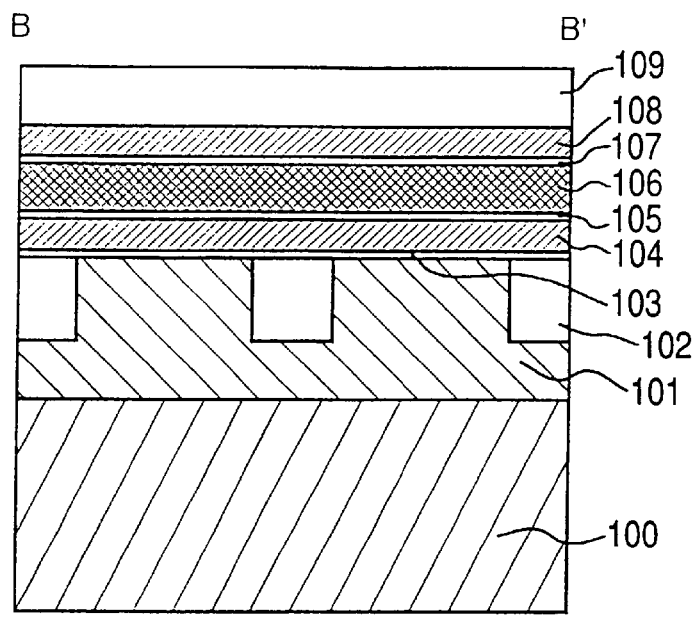
FIG. 45 is a B–B' cross-sectional view showing a manufacturing process (2) of the memory cell of Embodiment 5.
Figure 46:
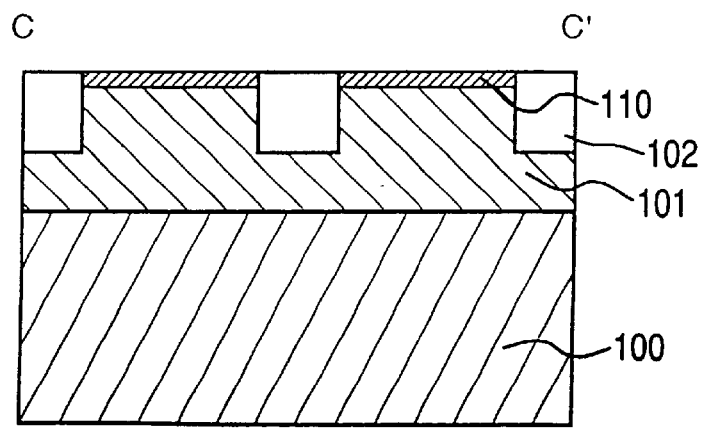
FIG. 46 is a C–C' cross-sectional view showing the manufacturing process (2) of the memory cell of Embodiment 5.

As shown in FIGS. 45 and 46, the gate oxide film 103 is formed to sequentially deposit the p-type polysilicon 104, the nitride film 105, the intrinsic polysilicon 106, the nitride film 107, the p-type polysilicon 108 and the nitride film 109. These are etched by the polisilicon processing pattern FG. The known ion implantation method is used to from the n-type diffusion layer 110.

Figure 47:
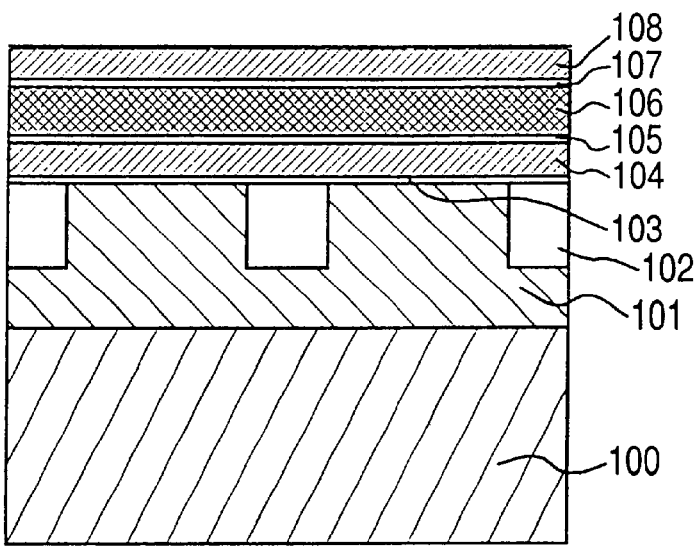
FIG. 47 is a B–B' cross-sectional view showing a manufacturing process (3) of the memory cell of Embodiment 5.
Figure 48:
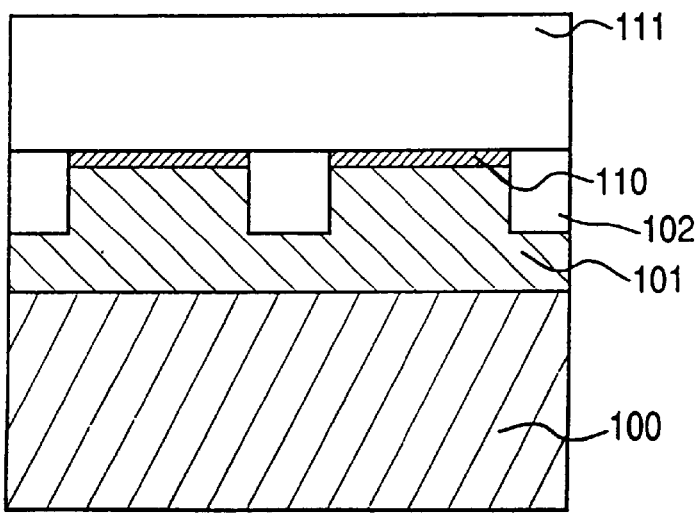
FIG. 48 is a C–C' cross-sectional view showing the manufacturing process (3) of the memory cell of Embodiment 5.

As shown in FIGS. 47 and 48, the interlayer oxide film 111 is buried to be flattened by CMP. In the CMP, the nitride film 109 serves as a stopper to remove the remaining nitride film 109. Unlike Embodiment 2, the data line contact need not be formed here. When the metal wiring layer 113 is used as the wire in the peripheral circuit, a contact forming process is performed in the peripheral circuit region.

Figure 51:
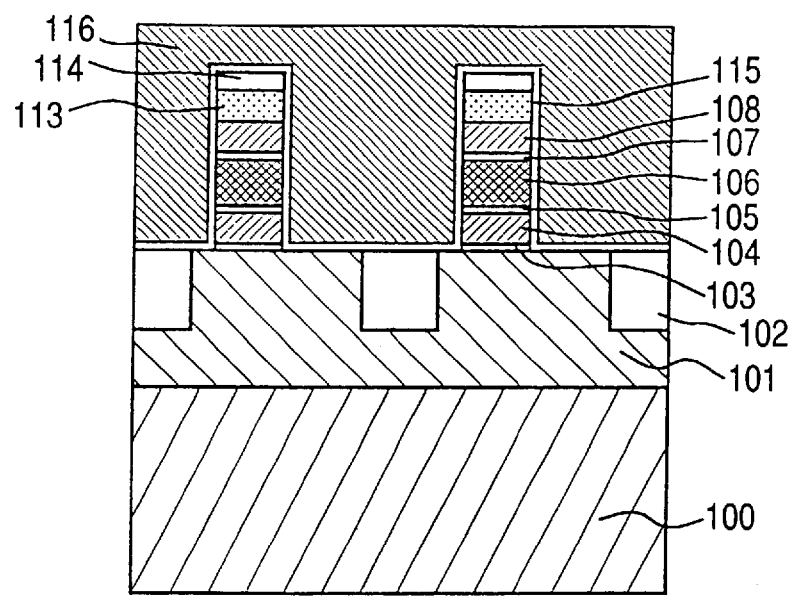
FIG. 51 is a B–B' cross-sectional view showing a manufacturing process (5) of the memory cell of Embodiment 5.
Figure 52:
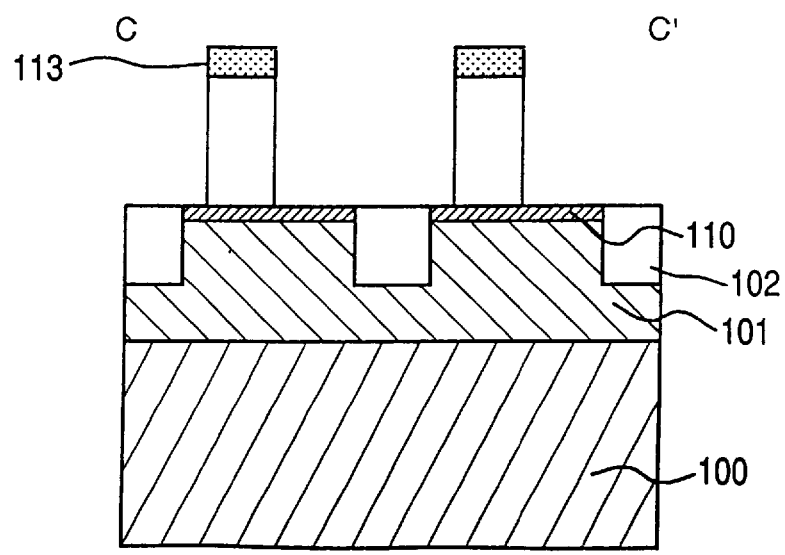
FIG. 52 is a C–C' cross-sectional view showing the manufacturing process (5) of the memory cell of Embodiment 5.

As shown in FIGS. 49 and 50, the metal wiring layer 113 as the write data line and the interlayer oxide film 114 are deposited by CVD. Etching is performed down to the gate oxide film 103 by the data line pattern SG. As shown in FIGS. 51 and 52, the gate oxide film 115 of the write transistor M0 and the non-selection transistor M2 is formed by CVD. The polysilicon layer 116 as the wordline is deposited by CVD to be etched by the wordline pattern TG.

Figure 53:
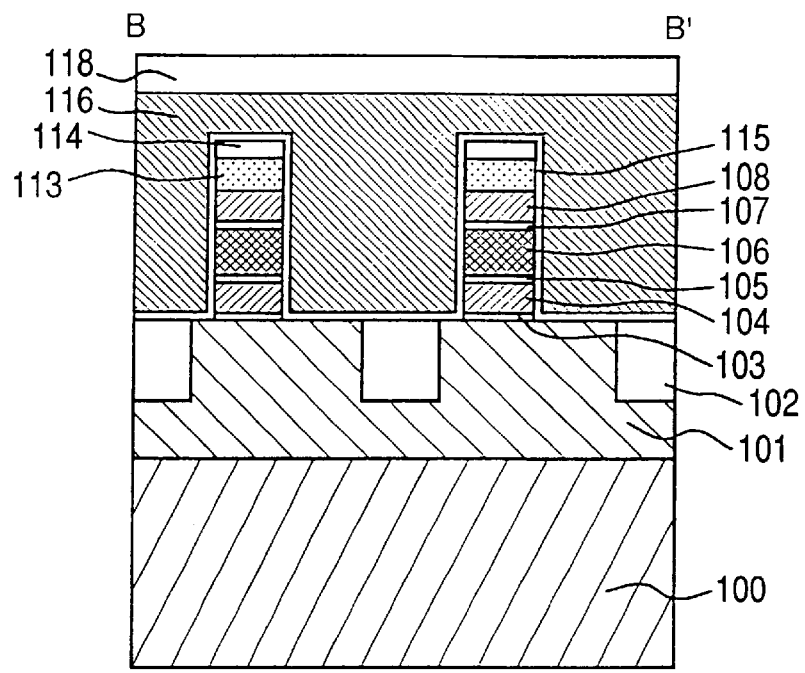
FIG. 53 is a B–B' cross-sectional view showing a manufacturing process (6) of the memory cell of Embodiment 6.
Figure 54:
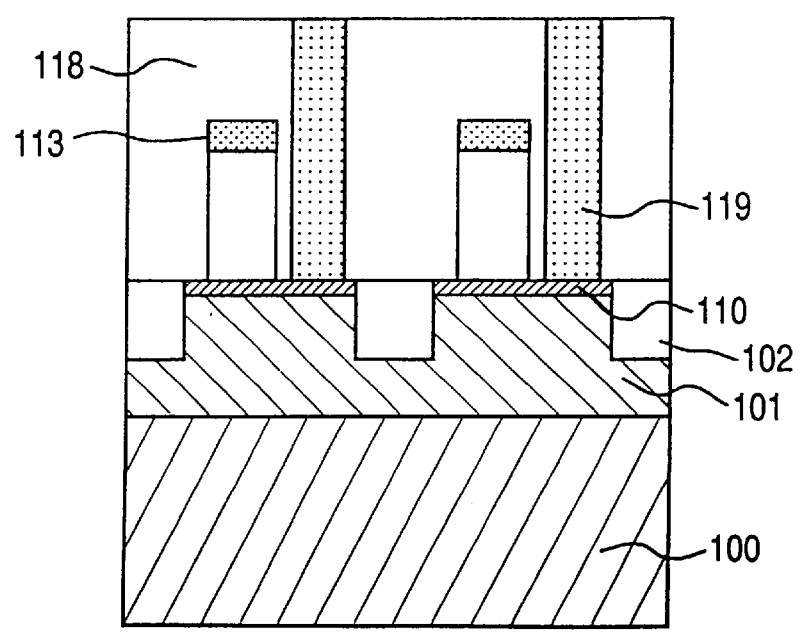
FIG. 54 is a C–C' cross-sectional view showing the manufacturing process (5) of the memory cell of Embodiment 6.

As shown in FIGS. 53 and 54, the interlayer insulator film 118 is deposited to be etched by the contact pattern LCNT. A connection hole is opened to be buried by barrier metal of titanium nitride and metal of tungsten to form the contact 119. The data line contact can be formed by polysilicon. Metal is used to lower the resistance.

The metal wire layer 120 is deposited to be etched by the metal wiring pattern M1L, realizing the structures of FIGS. 37 and 38.

Figure 55:
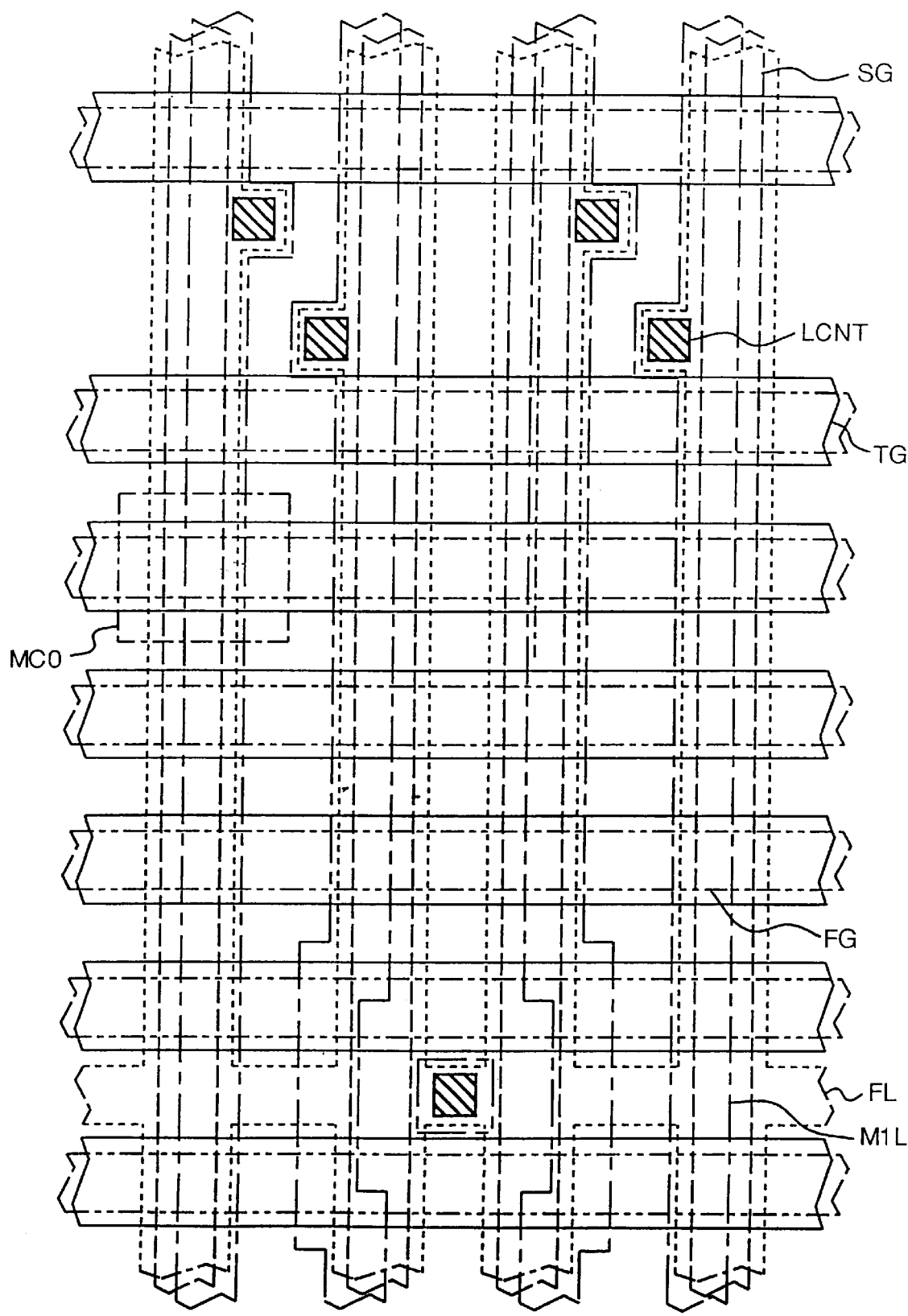
FIG. 55 is a diagram showing another layout of the memory cell of Embodiment 5.

FIG. 55 shows another layout realizing the memory cell structure shown in FIG. 37. The structure and manufacturing process are the sane as the example described above except for the layout. This drawing shows a memory cell block twice that of FIG. 39. As in FIG. 39, FL denotes an active region pattern; FG, a polysilicon processing pattern; SG, a data line pattern when forming the write data line DLW; TG, a wordline pattern; LCNT, a contact pattern; M1L, a metal wiring pattern when forming the read data line DLR.

In the layout of FIG. 39, the contact patterns LCNT of the read data line DLR are provided on the same side (the right side in the drawing) of the pattern SG of the write data line. The data line pitch is limitedly increased. To release this, in the layout shown in FIG. 55, the contact patterns LCNT are arranged alternately (in the right and left directions in the drawing) to the pattern SG of the write data line to decrease the data line pitch. The contact patterns LCNT are staggered so as not to opposite to each other. The space of the wordline patterns TG of the region adjacent to the contact pattern LCNT is increased. When the number of the memory cells per memory cell block is large, for example, it is eight, such layout decreases the area of the memory cell block. In the layout as shown in FIG. 55, about one contact every four read data lines is provided in the diffusion layer 110 of the source line for raising to the metal wire. The resistance of the source line can be reduced.

Industrial Applicability

The present invention can realize a highly integrated memory cell having an amplification function and is effective for realizing a semiconductor device having a small-area memory operated fast at a low voltage.

What is claimed is:

1. A semiconductor device formed on a substrate comprising:

a source line; and a memory block comprising a bit line, a plurality of word lines, and a plurality of memory cells;

wherein said plurality of memory cells are coupled between said source line and said bit line in serial, wherein each of said plurality of memory cells has a charging electrode, and wherein each of said plurality word lines is coupled to said charging electrode with an insulating layer therebetween, and is further coupled to said substrate with the insulating layer therebetween.

2. The semiconductor device according to claim 1, wherein a region of said word lines, each of which is coupled to said substrate, is used as a gate of a transistor included in each of said plurality of memory cells.

3. The semiconductor device according to claim 1, wherein said charging electrode is made on a semiconductor surface which is above a top surface of a field region.

4. The semiconductor device according to claim 2, wherein each of said plurality of memory cells has a multi-layered structure surrounded with each of said plurality of word lines with said insulating layer therebetween.

5. The semiconductor device according to claim 3, wherein each of said plurality of memory cells has a multi-layered structure surrounded on all sides by a layer forming said word lines with said insulating layer therebetween.

6. The semiconductor device according to claim 4, wherein each of said plurality of memory cells has a first, a second, and a third transistors, wherein said charging electrode is included in said first transistor, and wherein said second transistor is the transistor which has a semiconductor region in the substrate coupled to a respective word line.

7. The semiconductor device according to claim 6, wherein said first and second transistors are n-type transistors, and wherein said third transistor is a p-type transistor.

8. The semiconductor device according to claim 6, wherein said first transistor is coupled to said plurality of memory cells in serial, wherein said second transistor is coupled to said respective word line, and wherein said third transistor is coupled to said respective word line and is used for writing data in a respective memory cell.

* * * * *